(12) United States Patent
Diorio et al.

(10) Patent No.: US 10,885,421 B1
(45) Date of Patent: Jan. 5, 2021

(54) RFID INTEGRATED CIRCUITS WITH ANTENNA CONTACTS ON MULTIPLE SURFACES

(71) Applicant: Impinj, Inc., Seattle, WA (US)

(72) Inventors: Christopher J. Diorio, Shoreline, WA (US); Ronald L. Koepp, Seattle, WA (US); Harley K. Heinrich, Snohomish, WA (US); Theron Stanford, Seattle, WA (US); Ronald A. Oliver, Seattle, WA (US)

(73) Assignee: Impinj, Inc., Seattle, WA (US)

( * ) Notice: Subject to any disclaimer, the term of this patent is extended or adjusted under 35 U.S.C. 154(b) by 0 days.

(21) Appl. No.: 16/410,016

(22) Filed: May 13, 2019

Related U.S. Application Data

(63) Continuation of application No. 15/870,775, filed on Jan. 12, 2018, now Pat. No. 10,311,351, which is a
(Continued)

(51) Int. Cl.
*G06K 19/077* (2006.01)
*G06K 19/07* (2006.01)
(Continued)

(52) U.S. Cl.
CPC ... *G06K 19/07775* (2013.01); *G06K 19/0723* (2013.01); *G06K 19/07743* (2013.01); *G06K 19/07745* (2013.01); *G06K 19/07747* (2013.01); *H01L 23/49855* (2013.01); *H01L 24/95* (2013.01); *H01Q 1/2225* (2013.01);
(Continued)

(58) Field of Classification Search
CPC ............ G06K 19/044; G06K 19/0723; G06K 19/07743; G06K 19/07745; G06K 19/0775–07756; G06K 19/07773–07794; H01Q 1/2225; H01Q 1/2283; H01L 23/49855
See application file for complete search history.

(56) References Cited

U.S. PATENT DOCUMENTS 6,147,605 A 11/2000 Vega et al.
6,407,669 B1 6/2002 Brown et al.
(Continued)

OTHER PUBLICATIONS

International Preliminary Report on Patentability for PCT/US2012/054531 filed Sep. 10, 2012, dated Oct. 23, 2014, issued Oct. 14, 2014.
(Continued)

*Primary Examiner* — Scott B Geyer
(74) *Attorney, Agent, or Firm* — Hertzberg, Turk & Associates, LLC

(57) ABSTRACT

Embodiments are directed to a Radio Frequency Identification (RFID) integrated circuit (IC) having a first circuit block electrically coupled to first and second antenna contacts. The first antenna contact is disposed on a first surface of the IC and the second antenna contact is disposed on a second surface of the IC different from the first surface. A substrate of the RFID IC, or a portion of the IC substrate, electrically couples the first circuit block to at least one of the first and second antenna contacts. The IC includes one or more interfaces or barrier regions that at least partially electrically isolate the first circuit block from the rest of the IC substrate.

20 Claims, 12 Drawing Sheets

Related U.S. Application Data continuation-in-part of application No. 15/015,452, filed on Feb. 4, 2016, now Pat. No. 9,875,438, which is a continuation of application No. 14/714,249, filed on May 16, 2015, now abandoned, which is a continuation of application No. 13/904,536, filed on Aug. 23, 2013, now Pat. No. 9,053,400, which is a continuation of application No. 13/820,473, filed as application No. PCT/US2012/054531 on Sep. 10, 2012, now abandoned.

(60) Provisional application No. 61/681,305, filed on Aug. 9, 2012, provisional application No. 61/623,016, filed on Apr. 11, 2012.

(51) Int. Cl.
*H01L 23/00* (2006.01)
*H01L 23/498* (2006.01)
*H01Q 1/22* (2006.01)

(52) U.S. Cl.
CPC ... *H01Q 1/2283* (2013.01); *H01L 2223/6677* (2013.01); *H01L 2924/12042* (2013.01); *H01L 2924/13063* (2013.01); *Y10T 29/49018* (2015.01)

(56) References Cited

U.S. PATENT DOCUMENTS

| | | |
|---|---|---|
| 6,693,541 B2 | 2/2004 | Egbert |
| 7,298,343 B2 | 11/2007 | Forster et al. |
| 7,503,491 B2 | 3/2009 | Zhu et al. |
| 7,675,464 B2 | 3/2010 | Cleeves |
| 7,768,405 B2 | 8/2010 | Yamazaki et al. |
| 7,828,221 B2 | 11/2010 | Kwon |
| 8,350,768 B2 | 1/2013 | Peters |
| 8,628,018 B2 | 1/2014 | Zenz et al. |
| 9,053,400 B2 | 6/2015 | Diorio et al. |
| 9,875,438 B1 | 1/2018 | Diorio et al. |
| 2003/0006936 A1 | 1/2003 | Aoyama et al. |
| 2006/0290514 A1 | 12/2006 | Sakama et al. |
| 2007/0095926 A1 | 5/2007 | Zhu et al. |
| 2007/0238245 A1* | 10/2007 | Cote ............... H01L 21/4853 438/243 |
| 2008/0258916 A1 | 10/2008 | Diorio et al. |
| 2008/0277484 A1 | 11/2008 | Launay et al. |
| 2009/0027208 A1 | 1/2009 | Martin et al. |
| 2009/0145971 A1 | 6/2009 | Yin |
| 2009/0231139 A1 | 9/2009 | Heurtier |
| 2010/0001079 A1 | 1/2010 | Martin et al. |
| 2010/0038433 A1 | 2/2010 | Ikemoto |
| 2010/0224685 A1 | 9/2010 | Aoki |
| 2010/0253583 A1 | 10/2010 | Furutani |
| 2010/0302038 A1 | 12/2010 | Brommer et al. |
| 2010/0308968 A1 | 12/2010 | Tamm et al. |
| 2011/0011939 A1 | 1/2011 | Seah |
| 2011/0090058 A1 | 4/2011 | Ikemoto |
| 2011/0148737 A1 | 6/2011 | Kang |
| 2011/0242779 A1 | 10/2011 | Grasset |
| 2011/0293969 A1 | 12/2011 | Hoofman et al. |
| 2012/0019363 A1 | 1/2012 | Fein |
| 2012/0049937 A1 | 3/2012 | Waffaoui |
| 2012/0056337 A1* | 3/2012 | Shiroki ............... H01Q 9/285 257/782 |
| 2012/0080527 A1 | 4/2012 | Finn |

OTHER PUBLICATIONS

International Search Report and Written Opinion for PCT/US2012/054531 filed Sep. 10, 2012, dated Nov. 27, 2012.
Non-Final Office Action dated Dec. 17, 2014 for Parent U.S. Appl. No. 13/820,473, filed Aug. 23, 2013.
Non-Final Office Action dated Dec. 10, 2014 for Related U.S. Appl. No. 13/904,479, filed Aug. 23, 2013.
Non-Final Office Action dated Dec. 5, 2014 for Related U.S. Appl. No. 13/904,395, filed Aug. 23, 2013.
Final Office Action received for U.S. Appl. No. 13/820,473, dated Jun. 5, 2015 and filed Aug. 23, 2013.
Final Office Action received for U.S. Appl. No. 13/904,395, dated Jun. 2, 2015 and filed Aug. 23, 2013.
Non-Final Office Action received in U.S. Appl. No. 13/820,473 dated Aug. 5, 2015 and filed Aug. 23, 2013.

* cited by examiner

SIGNAL PATH DURING R→T

SIGNAL PATH DURING T→R

RFID INTEGRATED CIRCUITS WITH ANTENNA CONTACTS ON MULTIPLE SURFACES

CROSS-REFERENCE TO RELATED APPLICATIONS

This Application is a continuation under 35 U.S.C. § 120 of U.S. patent application Ser. No. 15/870,775 filed on Jan. 12, 2018, which is a continuation-in-part of U.S. patent application Ser. No. 15/015,452 filed on Feb. 4, 2016, which is a continuation under 35 U.S.C. § 120 of U.S. patent application Ser. No. 14/714,249 filed on May 16, 2015, which is a continuation under 35 U.S.C. § 120 of U.S. Pat. No. 9,053,400 issued on Jun. 9, 2015, which is a continuation under 35 U.S.C. § 120 of U.S. patent application Ser. No. 13/820,473 filed on Aug. 23, 2013, which is the U.S. National Stage filing under 35 U.S.C. § 371 of PCT Application Ser. No. PCT/US12/54531 filed on Sep. 10, 2012. The disclosures of the U.S. Patents, Patent Applications, and the PCT Application are hereby incorporated by reference in their entireties. The PCT Application Ser. No. PCT/US12/54531 claims the benefit of U.S. Provisional Patent Application Ser. No. 61/623,016 filed on Apr. 11, 2012 and U.S. Provisional Patent Application Ser. No. 61/681,305 filed on Aug. 9, 2012. The disclosures of the provisional patent applications are hereby incorporated by reference in their entireties.

BACKGROUND

Radio-Frequency Identification (RFID) systems typically include RFID readers, also known as RFID reader/writers or RFID interrogators, and RFID tags. RFID systems can be used to inventory, locate, identify, authenticate, configure, enable/disable, and monitor items to which the tags are attached or in which the tags are embedded. RFID systems may be used in retail applications to inventory and track items; in consumer- and industrial-electronics applications to configure and monitor items; in security applications to prevent loss or theft of items; in anti-counterfeiting applications to ensure item authenticity; and in myriad other applications.

RFID systems operate by an RFID reader interrogating one or more tags using a Radio Frequency (RF) wave. The RF wave is typically electromagnetic, at least in the far field. The RF wave can also be predominantly electric or magnetic in the near field. The RF wave may encode one or more commands that instruct the tags to perform one or more actions.

A tag that senses the interrogating RF wave may respond by transmitting back a responding RF wave (a response). A tag may generate the response either originally, or by reflecting back a portion of the interrogating RF wave in a process known as backscatter. Backscatter may take place in a number of ways.

The reader receives, demodulates, and decodes the response. The decoded response may include data stored in the tag such as a serial number, price, date, time, destination, encrypted message, electronic signature, other data, any combination of tag data, and so on. The decoded response may also include status information or attributes about the tag or item such as a tag status message, item status message, configuration data, and so on.

An RFID tag typically includes an antenna and an RFID integrated circuit (IC) comprising a radio section, a power management section, and frequently a logical section, a memory, or both. In some RFID ICs, the logical section may include a cryptographic algorithm which may rely on one or more passwords or keys stored in tag memory. In earlier RFID tags the power management section often used an energy storage device such as a battery. RFID tags with an energy storage device are known as battery-assisted, semi-active, or active tags. Advances in semiconductor technology have miniaturized the IC electronics so much that an RFID tag can be powered solely by the RF signal it receives. Such RFID tags do not include an energy storage device and are called passive tags. Of course, even passive tags typically include temporary energy- and data/flag-storage elements such as capacitors or inductors.

In typical RFID tags the IC is electrically coupled to the antenna, which in turn is disposed on a substrate. As technology advances and ICs shrink, assembling, aligning, and coupling the IC to the antenna becomes challenging.

BRIEF SUMMARY

This summary introduces a selection of concepts in a simplified form that are further described below in the Detailed Description. This summary is not intended to identify key features or essential features of the claimed subject matter, nor is it intended as an aid in determining the scope of the claimed subject matter.

An RFID IC is typically electrically coupled to an antenna via two or more antenna contacts situated on a single surface of the IC, that couple to two or more antenna terminals when the IC is assembled onto the antenna. This coupling may be face-down, by placing the IC face down on the antenna terminals such that the antenna contacts electrically couple to the terminals. This face-down case involves aligning the antenna contacts with the antenna terminals during assembly and making an electrical (galvanic, capacitive, or inductive) connection between them. Or it may be face-up, by placing the IC face up on the substrate and attaching bondwires between the antenna contacts and the antenna terminals. This face-up case involves attaching wires from the antenna contacts to the antenna terminals. Because the antenna contacts are situated on a single surface of the IC, as IC sizes shrink the contacts also shrink, often both in size (the area of each contact) and spacing (the distance between contacts). This shrinkage increases the cost of coupling the antenna contacts to the antenna terminals, in the face-down case due to alignment tolerances, and in the face-up case due to bondwire attachment tolerances. Both cases involve complicated assembly machines with consequent high cost. Using an intermediate element between the IC and the antenna, such as a strap or an interposer, does not alleviate the problem because the IC-to-strap alignment then becomes the bottleneck.

Embodiments are directed to placing the antenna contacts on different surfaces of the IC, and using antennas and assembly methods that electrically couple the antenna terminals to the different surfaces. For example, one contact may be disposed on one surface of the IC, and another contact may be disposed on the opposing surface of the IC. Using multiple IC surfaces increases the effective area for, and provides a natural separation between, the antenna contacts. The result is simplified and lower-cost IC-to-antenna assembly.

According to some embodiments, a Radio Frequency Identification (RFID) integrated circuit (IC) having a first circuit block electrically coupled to first and second antenna contacts is provided. The first antenna contact is disposed on a first surface of the IC and the second antenna contact is disposed on a second surface of the IC different from the first surface. A substrate of the RFID IC, or a portion of the IC substrate, electrically couples the first circuit block to at least one of the first and second antenna contacts. The IC includes one or more interfaces or barrier regions that at least partially electrically isolate the first circuit block from the rest of the IC substrate.

These and other features and advantages will be apparent from a reading of the following detailed description and a review of the associated drawings. It is to be understood that both the foregoing general description and the following detailed description are explanatory only and are not restrictive of aspects as claimed.

BRIEF DESCRIPTION OF THE DRAWINGS

The following Detailed Description proceeds with reference to the accompanying Drawings, in which.

DETAILED DESCRIPTION

In the following detailed description, references are made to the accompanying drawings that form a part hereof, and in which are shown by way of illustration specific embodiments or examples. These embodiments or examples may be combined, other aspects may be utilized, and structural changes may be made without departing from the spirit or scope of the present disclosure. The following detailed description is therefore not to be taken in a limiting sense, and the scope of the present invention is defined by the appended claims and their equivalents.

Figure 1:
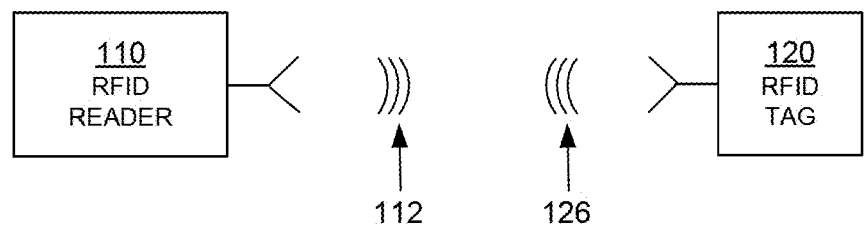
FIG. 1 is a block diagram of components of an RFID system.

FIG. 1 is a diagram of the components of a typical RFID system 100, incorporating embodiments. An RFID reader 110 transmits an interrogating RF signal 112. RFID tag 120 in the vicinity of RFID reader 110 senses interrogating RF signal 112 and generate signal 126 in response. RFID reader 110 senses and interprets signal 126. The signals 112 and 126 may include RF waves and/or non-propagating RF signals (e.g., reactive near-field signals).

Reader 110 and tag 120 communicate via signals 112 and 126. When communicating, each encodes, modulates, and transmits data to the other, and each receives, demodulates, and decodes data from the other. The data can be modulated onto, and demodulated from, RF waveforms. The RF waveforms are typically in a suitable range of frequencies, such as those near 900 MHz, 13.56 MHz, and so on.

The communication between reader and tag uses symbols, also called RFID symbols. A symbol can be a delimiter, a calibration value, and so on. Symbols can be implemented for exchanging binary data, such as "0" and "1", if that is desired. When symbols are processed by reader 110 and tag 120 they can be treated as values, numbers, and so on.

Tag 120 can be a passive tag, or an active or battery-assisted tag (i.e., a tag having its own power source). When tag 120 is a passive tag, it is powered from signal 112.

Figure 2:
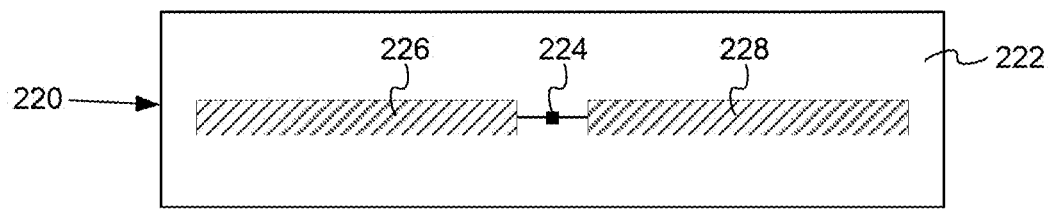
FIG. 2 is a diagram showing components of a passive RFID tag, such as a tag that can be used in the system of FIG. 1.
Figure 2:
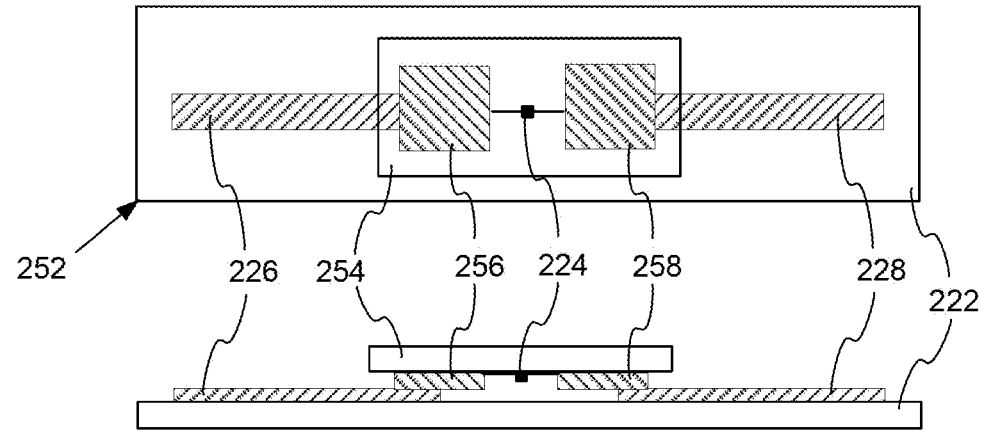
Figure 2:
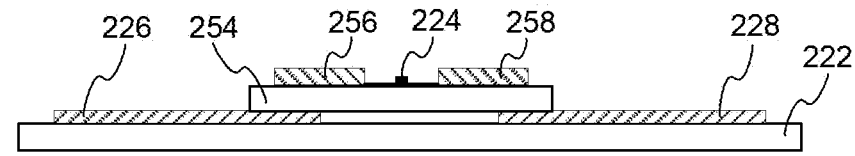

FIG. 2 is a diagram of an RFID tag 220, which may function as tag 120 of FIG. 1. Tag 220 is drawn as a passive tag, meaning it does not have its own power source. Much of what is described in this document, however, applies also to active and battery-assisted tags.

Tag 220 is typically (although not necessarily) formed on a substantially planar inlay 222, which can be made in many ways known in the art. Tag 220 includes a circuit which may be implemented as an IC 224. In some embodiments IC 224 is implemented in complementary metal-oxide semiconductor (CMOS) technology. In other embodiments IC 224 may be implemented in other technologies such as bipolar junction transistor (BJT) technology, metal-semiconductor field-effect transistor (MESFET) technology, and others as will be well known to those skilled in the art. IC 224 is arranged on inlay 222.

Tag 220 also includes an antenna for exchanging wireless signals with its environment. The antenna is often flat and attached to inlay 222. IC 224 is electrically coupled to the antenna via suitable IC contacts (not shown in FIG. 2). The term "electrically coupled" as used herein may mean a direct electrical connection, or it may mean a connection that includes one or more intervening circuit blocks, elements, or devices. The "electrical" part of the term "electrically coupled" as used in this document shall mean a coupling that is one or more of ohmic/galvanic, capacitive, and/or inductive. Similarly, the term "electrically isolated" as used herein means that electrical coupling of one or more types (e.g., galvanic, capacitive, and/or inductive) is not present, at least to the extent possible. For example, elements that are electrically isolated from each other are galvanically isolated from each other, capacitively isolated from each other, and/or inductively isolated from each other. Of course, electrically isolated components will generally have some unavoidable stray capacitive or inductive coupling between them, but the intent of the isolation is to minimize this stray coupling to a negligible level when compared with an electrically coupled path.

IC 224 is shown with a single antenna port, comprising two IC contacts electrically coupled to two antenna segments 226 and 228 which are shown here forming a dipole. Many other embodiments are possible using any number of ports, contacts, antennas, and/or antenna segments.

Diagram 250 depicts top and side views of tag 252, formed using a strap. Tag 252 differs from tag 220 in that it includes a substantially planar strap substrate 254 having strap contacts 256 and 258. IC 224 is mounted on strap substrate 254 such that the IC contacts on IC 224 electrically couple to strap contacts 256 and 258 via suitable connections (not shown). Strap substrate 254 is then placed on inlay 222 such that strap contacts 256 and 258 electrically couple to antenna segments 226 and 228. Strap substrate 254 may be affixed to inlay 222 via pressing, an interface layer, one or more adhesives, or any other suitable means.

Diagram 260 depicts a side view of an alternative way to place strap substrate 254 onto inlay 222. Instead of strap substrate 254's surface, including strap contacts 256/258, facing the surface of inlay 222, strap substrate 254 is placed with its strap contacts 256/258 facing away from the surface of inlay 222. Strap contacts 256/258 can then be either capacitively coupled to antenna segments 226/228 through strap substrate 254, or conductively coupled using a through-via which may be formed by crimping strap contacts 256/258 to antenna segments 226/228. In some embodiments, the positions of strap substrate 254 and inlay 222 may be reversed, with strap substrate 254 mounted beneath inlay 222 and strap contacts 256/258 electrically coupled to antenna segments 226/228 through inlay 222. Of course, in yet other embodiments strap contacts 256/258 may electrically couple to antenna segments 226/228 through both inlay 222 and strap substrate 254.

In operation, the antenna receives a signal and communicates it to IC 224, which may both harvest power and respond if appropriate, based on the incoming signal and the IC's internal state. If IC 224 uses backscatter modulation then it responds by modulating the antenna's reflectance, which generates response signal 126 from signal 112 transmitted by the reader. Electrically coupling and uncoupling the IC contacts of IC 224 can modulate the antenna's reflectance, as can varying the admittance of a shunt-connected circuit element which is coupled to the IC contacts. Varying the impedance of a series-connected circuit element is another means of modulating the antenna's reflectance. If IC 224 is capable of transmitting signals (e.g., has its own power source, is coupled to an external power source, and/or is able to harvest sufficient power to transmit signals), then IC 224 may respond by transmitting response signal 126.

In the embodiments of FIG. 2, antenna segments 226 and 228 are separate from IC 224. In other embodiments, the antenna segments may alternatively be formed on IC 224. Tag antennas according to embodiments may be designed in any form and are not limited to dipoles. For example, the tag antenna may be a patch, a slot, a loop, a coil, a horn, a spiral, a monopole, microstrip, stripline, or any other suitable antenna.

An RFID tag such as tag 220 is often attached to or associated with an individual item or the item packaging. An RFID tag may be fabricated and then attached to the item or packaging, or may be partly fabricated before attachment to the item or packaging and then completely fabricated upon attachment to the item or packaging. In some embodiments, the manufacturing process of the item or packaging may include the fabrication of an RFID tag. In these embodiments, the resulting RFID tag may be integrated into the item or packaging, and portions of the item or packaging may serve as tag components. For example, conductive item or packaging portions may serve as tag antenna segments or contacts. Nonconductive item or packaging portions may serve as tag substrates or inlays. If the item or packaging includes integrated circuits or other circuitry, some portion of the circuitry may be configured to operate as part or all of an RFID tag IC.

The components of the RFID system of FIG. 1 may communicate with each other in any number of modes. One such mode is called full duplex, where both reader 110 and tag 120 can transmit at the same time. In some embodiments, RFID system 100 may be capable of full duplex communication if tag 120 is configured to transmit signals as described above. Another such mode, suitable for passive tags, is called half-duplex, and is described below.

Figure 3:
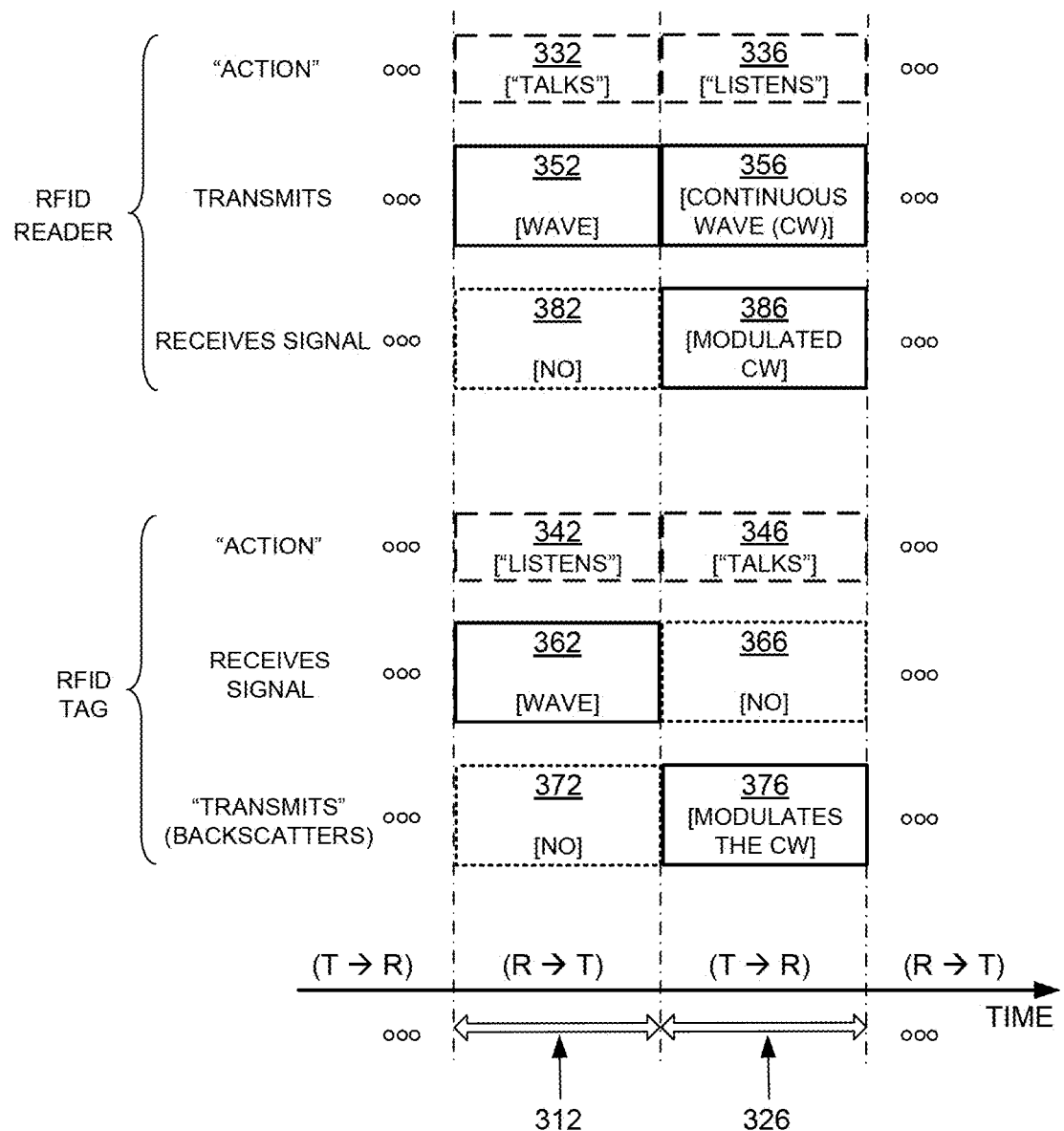
FIG. 3 is a conceptual diagram for explaining a half-duplex mode of communication between the components of the RFID system of FIG. 1.

FIG. 3 is a conceptual diagram 300 for explaining half-duplex communications between the components of the RFID system of FIG. 1, in this case with tag 120 implemented as passive tag 220 of FIG. 2. The explanation is made with reference to a TIME axis, and also to a human metaphor of "talking" and "listening". The actual technical implementations for "talking" and "listening" are now described.

RFID reader 110 and RFID tag 120 talk and listen to each other by taking turns. As seen on axis TIME, when reader 110 talks to tag 120 the communication session is designated as "R→T", and when tag 120 talks to reader 110 the communication session is designated as "T→R". Along the TIME axis, a sample R→T communication session occurs during a time interval 312, and a following sample T→R communication session occurs during a time interval 326. Interval 312 may typically be of a different duration than interval 326—here the durations are shown approximately equal only for purposes of illustration.

According to blocks 332 and 336, RFID reader 110 talks during interval 312, and listens during interval 326. According to blocks 342 and 346, RFID tag 120 listens while reader 110 talks (during interval 312), and talks while reader 110 listens (during interval 326).

In terms of actual behavior, during interval 312 reader 110 talks to tag 120 as follows. According to block 352, reader 110 transmits signal 112, which was first described in FIG. 1. At the same time, according to block 362, tag 120 receives signal 112 and processes it to extract data and so on. Meanwhile, according to block 372, tag 120 does not backscatter with its antenna, and according to block 382, reader 110 has no signal to receive from tag 120.

During interval 326, tag 120 talks to reader 110 as follows. According to block 356, reader 110 transmits a Continuous Wave (CW) signal, which can be thought of as a carrier that typically encodes no information. This CW signal serves both to transfer energy to tag 120 for its own internal power needs, and also as a carrier that tag 120 can modulate with its backscatter. Indeed, during interval 326, according to block 366, tag 120 does not receive a signal for processing. Instead, according to block 376, tag 120 modulates the CW emitted according to block 356 so as to generate backscatter signal 126. Concurrently, according to block 386, reader 110 receives backscatter signal 126 and processes it.

Figure 4:
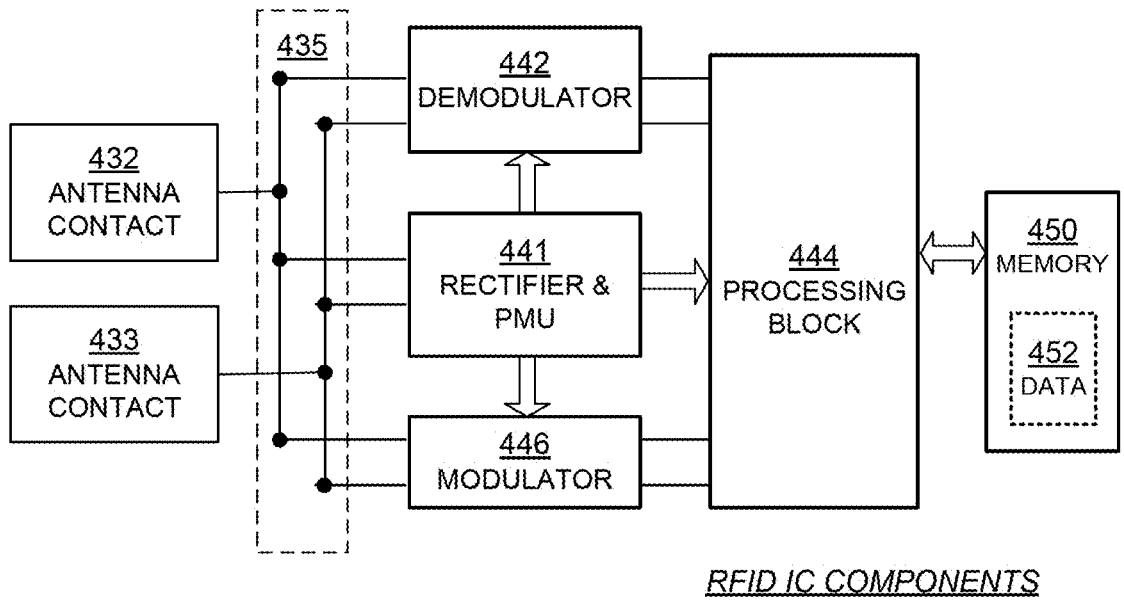
FIG. 4 is a block diagram showing a detail of an RFID IC, such as the one shown in FIG. 2.

FIG. 4 is a block diagram showing a detail of an RFID IC, such as IC 224 in FIG. 2. Electrical circuit 424 in FIG. 4 may be formed in an IC of an RFID tag, such as tag 220 of FIG. 2. Circuit 424 has a number of main components that are described in this document. Circuit 424 may have a number of additional components from what is shown and described, or different components, depending on the exact implementation.

Circuit 424 shows two IC contacts 432, 433, suitable for coupling to antenna segments such as antenna segments 226/228 of RFID tag 220 of FIG. 2. When two IC contacts form the signal input from and signal return to an antenna they are often referred-to as an antenna port. IC contacts 432, 433 may be made in any suitable way, such as from metallic pads and so on. In some embodiments circuit 424 uses more than two IC contacts, especially when tag 220 has more than one antenna port and/or more than one antenna.

Circuit 424 includes signal-routing section 435 which may include signal wiring, signal-routing busses, receive/transmit switches, and so on that can route a signal to the components of circuit 424. In some embodiments IC contacts 432/433 couple galvanically and/or inductively to signal-routing section 435. In other embodiments (such as is shown in FIG. 4) circuit 424 includes optional coupling capacitors 436 and/or 438 which, if present, capacitively couple IC contacts 432/433 to signal-routing section 435. This capacitive coupling causes IC contacts 432/433 to be galvanically decoupled from signal-routing section 435 and other circuit components.

Capacitive coupling (and resultant galvanic decoupling) between IC contacts 432 and/or 433 and components of circuit 424 is desirable in certain situations. For example, in some RFID tag embodiments IC contacts 432 and 433 may galvanically couple to terminals of a tuning loop on the tag. In this situation, coupling capacitors 436 and/or 438 galvanically decouple IC contact 432 from IC contact 433, thereby preventing the formation of a short circuit between the IC contacts through the tuning loop.

Coupling capacitors 436/438 may be implemented within circuit 424 and/or partly or completely external to circuit 424. For example, a dielectric or insulating layer on the surface of the IC containing circuit 424 may serve as the dielectric in capacitor 436 and/or capacitor 438. As another example, a dielectric or insulating layer on the surface of a tag substrate (e.g., inlay 222 or strap substrate 254) may serve as the dielectric in capacitors 436/438. Metallic or conductive layers positioned on both sides of the dielectric layer (i.e., between the dielectric layer and the IC and between the dielectric layer and the tag substrate) may then serve as terminals of the capacitors 436/438. The conductive layers may include IC contacts (e.g., IC contacts 432/433), antenna segments (e.g., antenna segments 226/228), or any other suitable conductive layers.

Circuit 424 also includes a rectifier and PMU (Power Management Unit) 441 that harvests energy from the RF signal received by antenna segments 226/228 to power the circuits of IC 424 during either or both reader-to-tag (R→T) and tag-to-reader (T→R) sessions. Rectifier and PMU 441 may be implemented in any way known in the art.

Circuit 424 additionally includes a demodulator 442 that demodulates the RF signal received via IC contacts 432, 433. Demodulator 442 may be implemented in any way known in the art, for example including a slicer, an amplifier, and so on.

Circuit 424 further includes a processing block 444 that receives the output from demodulator 442 and performs operations such as command decoding, memory interfacing, and so on. In addition, processing block 444 may generate an output signal for transmission. Processing block 444 may be implemented in any way known in the art, for example by combinations of one or more of a processor, memory, decoder, encoder, and so on.

Circuit 424 additionally includes a modulator 446 that modulates an output signal generated by processing block 444. The modulated signal is transmitted by driving IC contacts 432, 433, and therefore driving the load presented by the coupled antenna segment or segments. Modulator 446 may be implemented in any way known in the art, for example including a switch, driver, amplifier, and so on.

In one embodiment, demodulator 442 and modulator 446 may be combined in a single transceiver circuit. In another embodiment modulator 446 may modulate a signal using backscatter. In another embodiment modulator 446 may include an active transmitter. In yet other embodiments demodulator 442 and modulator 446 may be part of processing block 444.

Circuit 424 additionally includes a memory 450 to store data 452. At least a portion of memory 450 is preferably implemented as a Nonvolatile Memory (NVM), which means that data 452 is retained even when circuit 424 does not have power, as is frequently the case for a passive RFID tag.

In some embodiments, particularly in those with more than one antenna port, circuit 424 may contain multiple demodulators, rectifiers, PMUs, modulators, processing blocks, and/or memories.

In terms of processing a signal, circuit 424 operates differently during a R→T session and a T→R session. The different operations are described below, in this case with circuit 424 representing an IC of an RFID tag.

Figure 5A:
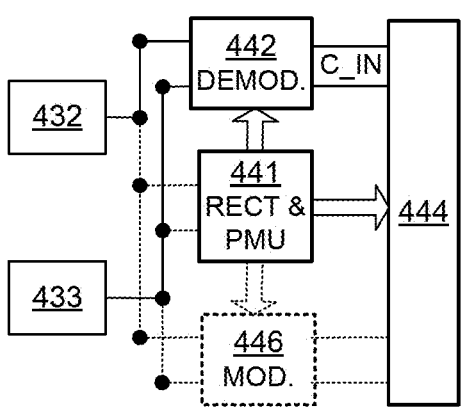
FIGS. 5A and 5B illustrate signal paths during tag-to-reader and reader-to-tag communications in the block diagram of FIG. 4.

FIG. 5A shows version 524-A of components of circuit 424 of FIG. 4, further modified to emphasize a signal operation during a R→T session during time interval 312 of FIG. 3. Demodulator 442 demodulates an RF signal received from IC contacts 432, 433. The demodulated signal is provided to processing block 444 as C_IN. In one embodiment, C_IN may include a received stream of symbols.

Version 524-A shows as relatively obscured those components that do not play a part in processing a signal during a R→T session. Rectifier and PMU 441 may be active, such as for converting RF power. Modulator 446 generally does not transmit during a R→T session, and typically does not interact with the received RF signal significantly, either because switching action in section 435 of FIG. 4 decouples modulator 446 from the RF signal, or by designing modulator 446 to have a suitable impedance, and so on.

Although modulator 446 is typically inactive during a R→T session, it need not be so. For example, during a R→T session modulator 446 could be adjusting its own parameters for operation in a future session, and so on.

Figure 5B:
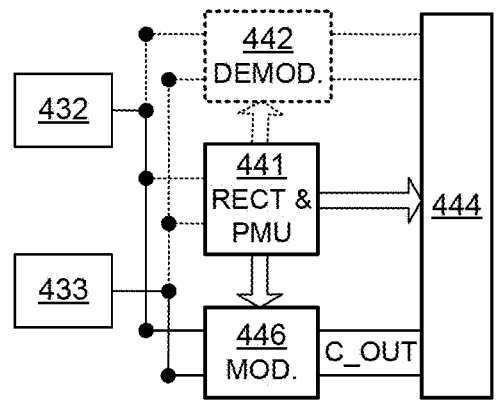

FIG. 5B shows version 524-B of components of circuit 424 of FIG. 4, further modified to emphasize a signal operation during a T→R session during time interval 326 of FIG. 3. Processing block 444 outputs a signal C_OUT. In one embodiment, C_OUT may include a stream of symbols for transmission. Modulator 446 then modulates C_OUT and provides it to antenna segments such as segments 226/228 of RFID tag 220 via IC contacts 432, 433.

Version 524-B shows as relatively obscured those components that do not play a part in processing a signal during a T→R session. Rectifier and PMU 441 may be active, such as for converting RF power. Demodulator 442 generally does not receive during a T→R session, and typically does not interact with the transmitted RF signal significantly, either because switching action in section 435 of FIG. 4 decouples demodulator 442 from the RF signal, or by designing demodulator 442 to have a suitable impedance, and so on.

Although demodulator 442 is typically inactive during a T→R session, it need not be so. For example, during a T→R session demodulator 442 could be adjusting its own parameters for operation in a future session, and so on.

In typical embodiments, demodulator 442 and modulator 446 are operable to demodulate and modulate signals according to a protocol, such as the Gen2 Specification mentioned above. In embodiments where circuit 424 includes multiple demodulators and/or modulators, each may be configured to support different protocols or different sets of protocols. A protocol specifies, in part, symbol encodings, and may include a set of modulations, rates, timings, or any other parameter associated with data communications. In addition, a protocol can be a variant of a stated specification such as the Gen2 Specification, for example including fewer or additional commands than the stated specification calls for, and so on. In such instances, additional commands are sometimes called custom commands.

Embodiments may also include methods of manufacturing an integrated circuit or tag as described herein. These methods may be performed in conjunction with one or more human operators. These human operators need not be collocated with each other, and each can be with a machine that performs a portion of the manufacturing.

Embodiments for manufacturing an integrated circuit or tag as described herein may additionally include programs, and methods of operating the programs. A program is generally defined as a group of steps or instructions leading to a desired result, due to the nature of the elements in the steps and their sequence.

Executing a program's steps or instructions requires manipulating physical quantities that represent information. These quantities may be electrical, magnetic, and electromagnetic charges or particles, states of matter, and in the more general case the states of any physical elements. These quantities are often transferred, combined, compared, and processed according to the steps or instructions. It is convenient at times to refer to the information represented by the states of these quantities as bits, data bits, samples, values, symbols, characters, terms, numbers, or the like. It should be borne in mind, however, that all of these and similar terms are associated with the appropriate physical quantities, and that these terms are merely convenient labels applied to these physical quantities, individually or in groups.

Executing a program's steps or instructions may further require storage media that have stored thereon a program's instructions and/or data, typically in a machine-readable form. This storage media is typically termed a memory, read by a processor or other machine element. In electronic devices, the memory may be implemented as Read Only Memory (ROM), Random Access Memory (RAM), and many others as will be well known to those skilled in the art. In some embodiments, the memory may be volatile and in others nonvolatile.

Even though it is said that a program is stored in a memory, it should be clear to a person skilled in the art that the program need not reside in a single memory, or even be executed by a single machine. Various portions, modules, data, or features of the program may reside in separate memories and be executed by separate machines.

Often, for sake of convenience, it is desirable to implement and describe a program for manufacturing an integrated circuit or tag according to embodiments as software. The software can be unitary or can be considered as various interconnected software modules.

Embodiments of an RFID integrated circuit, tag, or of a program for manufacturing an RFID integrated circuit or tag as described herein can be implemented as hardware, software, firmware, or any combination thereof. It is advantageous to consider such a tag as subdivided into components or modules. A person skilled in the art will recognize that some of these components or modules can be implemented as hardware, some as software, some as firmware, and some as a combination.

As described above, an RFID tag may be manufactured by placing an RFID IC (e.g., IC 224 in FIG. 2) on an antenna (e.g., antenna 227) disposed on a substrate (e.g. substrate 222) and electrically coupling contacts of the IC to terminals of the antenna. Conventional antenna contacts are disposed on a single surface of the IC, and electrically couple to the antenna terminals either by placing the IC face down on the antenna terminals such that the antenna contacts electrically couple to the antenna terminals, or by placing the IC face-up and attaching bondwires between the antenna contacts and the antenna terminals. However, as described above, as IC sizes shrink the corresponding antenna ports become smaller, both in terms of contact size and contact spacing. This shrinkage increases the cost of coupling the antenna contacts to the antenna terminals, in the face-down case due to tight alignment tolerances, and in the face-up case due to tight bondwire attachment tolerances.

Figure 6:
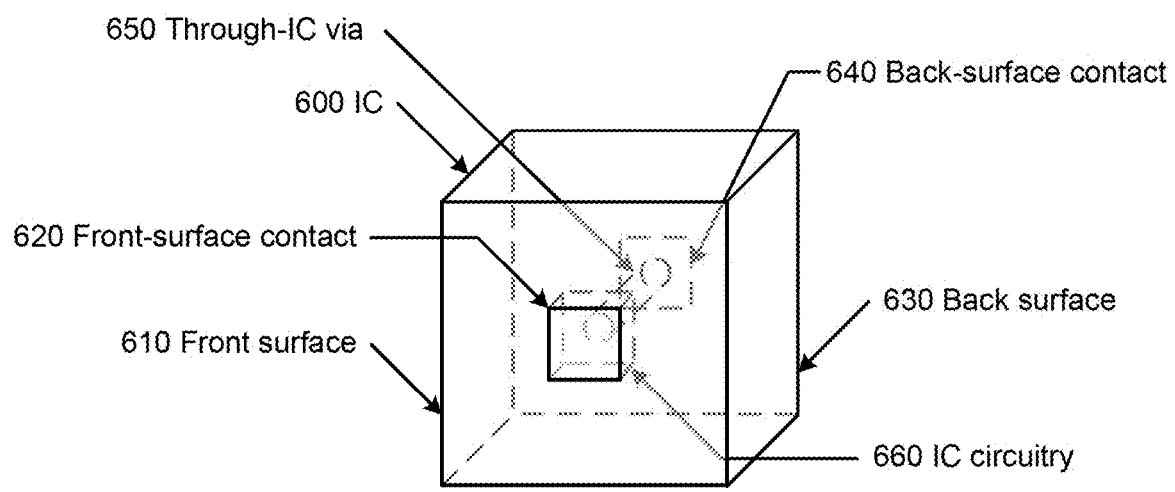
FIG. 6 is a conceptual diagram of an IC with antenna contacts on two surfaces (a dual-sided IC).

Disposing the antenna contacts on different surfaces of the IC addresses this issue. FIG. 6 is a conceptual diagram of a dual-sided IC 600 with antenna contacts on two different surfaces. In some embodiments IC 600 may be an RFID IC as described in relation to FIG. 2, although the concept is not limited to RFID ICs. Typical ICs have six surfaces (front surface 610, back surface 630, and four sides), although ICs with more-complex shapes may have more or fewer surfaces. In typical embodiments IC circuitry 660 is disposed in or on one of these surfaces and is electrically coupled to two antenna contacts disposed on any two non-identical surfaces. FIG. 6 shows a representative embodiment with IC circuitry on front surface 610, a front-surface contact 620 that couples directly to IC circuitry 660, and a back-surface contact 640 that couples to IC circuitry 660 by means of through-IC via 650. In FIG. 6, the front-surface contact 620 is only on the front surface 610 and the back-surface contact 640 is only on the back surface 630. However, in some embodiments, the front-surface contact 620 and/or the back-surface contact 640 may be present on multiple surfaces. For example, the front-surface contact 620 may be on the front surface 610 as well as on the back-surface 630 and/or any of the other four, unlabeled surfaces. Similarly, the back-surface contact 640 may be present on the back surface 630 as well as on the front surface 610 and/or any of the other four, unlabeled surfaces. Of course, in other embodiments contacts need not be disposed on opposite surfaces, and may be disposed on adjacent surfaces.

Figure 7:
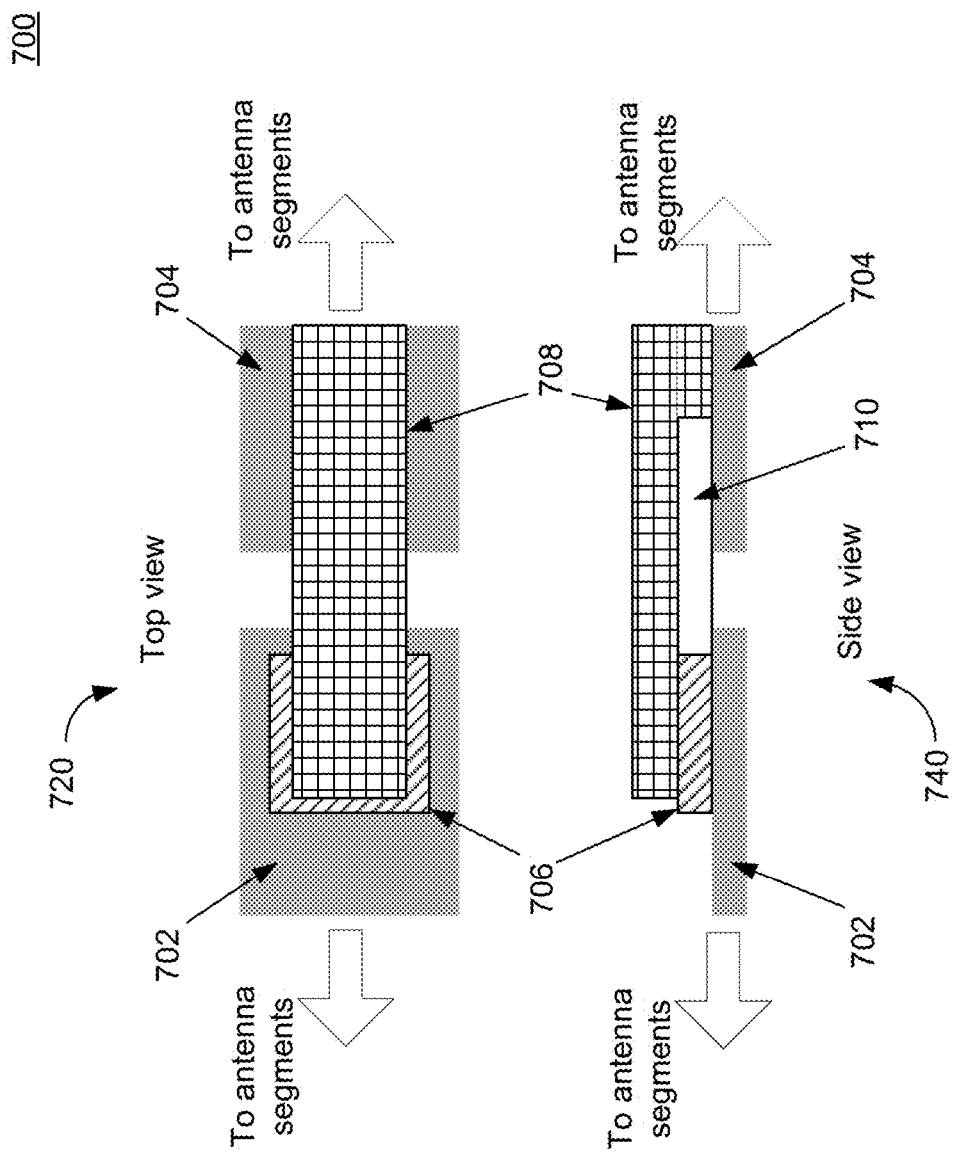
FIG. 7 is a conceptual diagram of a dual-sided IC contacting multiple antenna terminals according to embodiments.

FIG. 7 is a conceptual diagram showing a top view 720 and a side view 740 of a dual-sided IC coupled to antenna terminals 702 and 704 according to embodiments. The antenna terminals may, in turn, couple to or be part of antenna segments such as segments 227 in FIG. 2, or may form a strap or interposer suitable for connecting to antenna segments, or in the general case may be any type of precursor that allows IC 600 to be attached to an antenna or to another electrical component. In FIG. 7, dual-sided IC 706, such as IC 600 described above in relation to FIG. 6, is disposed between terminal 702 and an electrical bridge 708 such that its front-surface antenna contact (e.g., front-surface contact 620 in FIG. 6) is electrically coupled to terminal 702 and its back-surface antenna contact (e.g., back-surface contact 640 in FIG. 6) is electrically coupled to bridge 708. Bridge 708, in turn, electrically couples to terminal 704. Because IC 706 has front-to-back symmetry, it can alternatively be sandwiched between terminal 702 and bridge 708 with its back-surface antenna contact electrically coupled to terminal 702 and its front-surface antenna contact electrically coupled to bridge 708. Indeed, an advantage of the present invention is that in many embodiments IC 706 may be mounted front-side up or front-side down without impacting its operation.

In some embodiments, a dielectric layer 710 may be disposed between terminal 702 and bridge 708 to prevent an inadvertent short circuit between the terminal 702 and bridge 708.

In some embodiments, the electrical coupling between the elements in FIG. 7 (e.g. between IC 706, terminals 702 and 704, and/or bridge 708) may be capacitive or inductive rather than Ohmic or galvanic and may include a dielectric layer disposed between them. For example, a layer of non-conductive paste (NCP) or film may be disposed between IC 706 and terminal 702 and/or between IC 706 and bridge 708, and the coupling between them may be capacitive.

Figure 8:
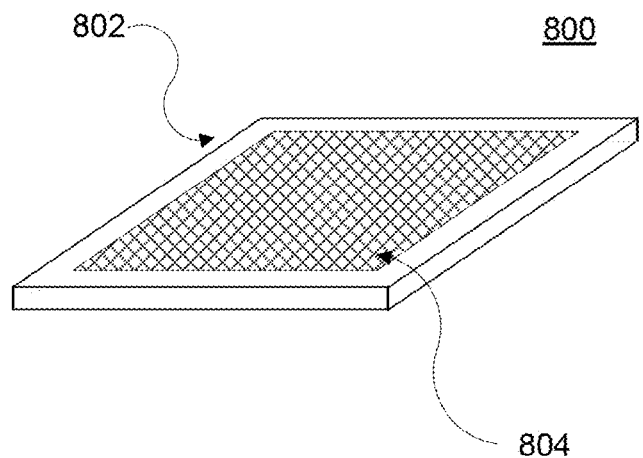
FIG. 8 illustrates IC configurations using large antenna contacts according to embodiments.
Figure 8:
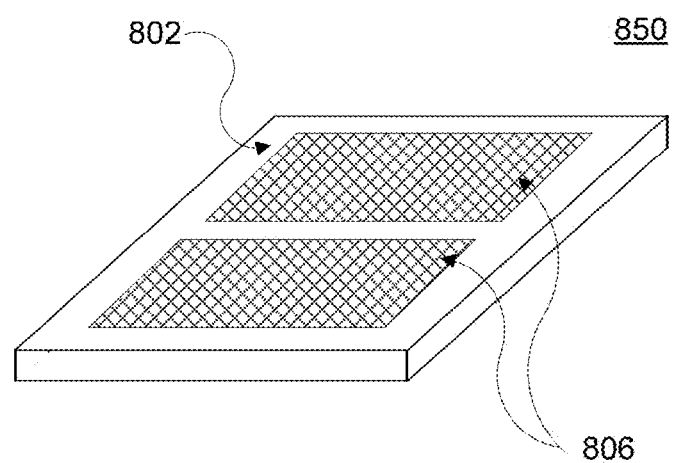

In some embodiments, the front-surface and/or back-surface contacts of IC 706 may use one or more large contact pads, as described in U.S. Pat. No. 8,661,652 issued on Mar. 4, 2014, which is hereby incorporated by reference in its entirety. FIG. 8 illustrates IC configurations 800 and 850 using large contact pads according to embodiments. In IC configuration 800, IC 802 has a single large contact pad 804 that substantially spans a surface of the IC. In IC configuration 850, IC 802 has two large contact pads 806 that together span a surface of the IC. Embodiments with more than two large contact pads are possible as well. For clarity, IC configurations 800 and 850 show only one IC surface (the top surface), but in embodiments according to the present invention multiple surfaces of IC 802 such as the bottom surface (not visible) or a side surface of IC 802 will also have one or more contact pads (either small or large). Also, although contact pads 804 and 806 are shown in FIG. 8 spanning substantially the entire surface of IC 802, in other embodiments the contact pads may be smaller and may merely span a reasonable portion of the IC surface.

In other embodiments, the contact pads may be shaped or formed in such a way as to improve adhesion between the contact pads and the antenna terminals. Examples include but are not limited to providing one or more cavities, slots, or gaps in the center of the contact pad(s) (not shown in FIG. 8) into which an adhesive (such as a conductive epoxy, nonconductive epoxy, contact adhesive, solder, or other similar material) may flow when the dual-sided IC and antenna terminals are assembled together. In this case the cavities or gaps act like grooves in a tire that prevent hydroplaning, but in the case of the present invention they provide a path for the adhesive to flow and bond.

In embodiments as disclosed herein, the large contact pads electrically couple to one or more antenna terminals or bridges (e.g., terminal 702 and/or bridge 708 in FIG. 7). Because the contact-pad area is large, the placement/alignment tolerances between the contact pads and the antenna terminals may be reduced compared to ICs with smaller antenna contacts, facilitating assembly. In some embodiments the contact pads, terminals, and/or bridges may include or be coated by a dielectric material, either naturally (such as a naturally-grown or enhanced oxide layer like aluminum oxide) or additively (such as a deposited dielectric). In such embodiments, the coupling between the contact pads and the antenna terminals will typically be capacitive or inductive.

Figure 9A:
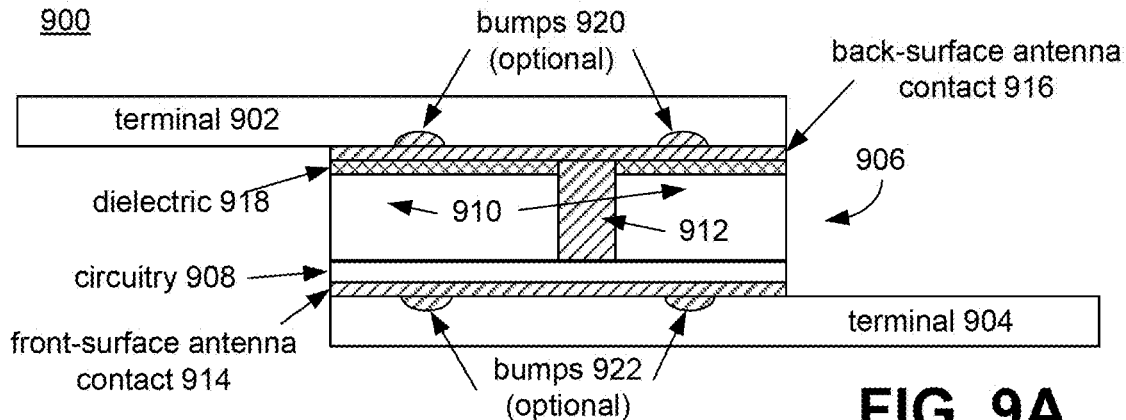
FIGS. 9A-C depict side cutaway views of dual-sided ICs contacting antenna terminals according to embodiments.
Figure 9B:
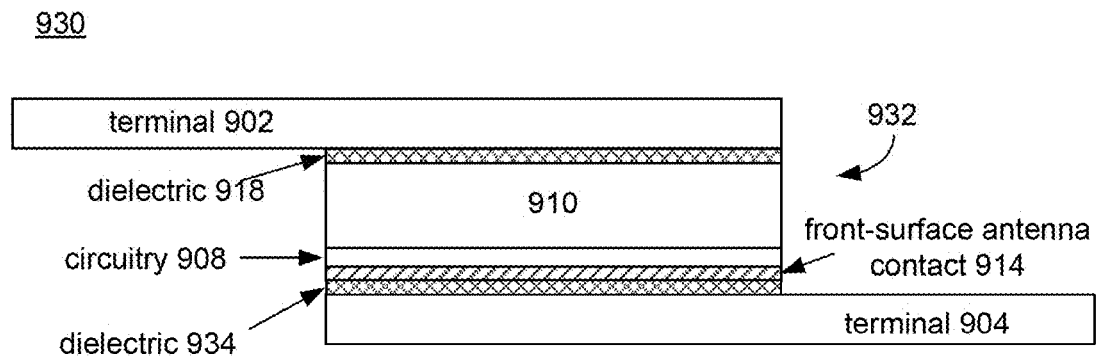
Figure 9C:
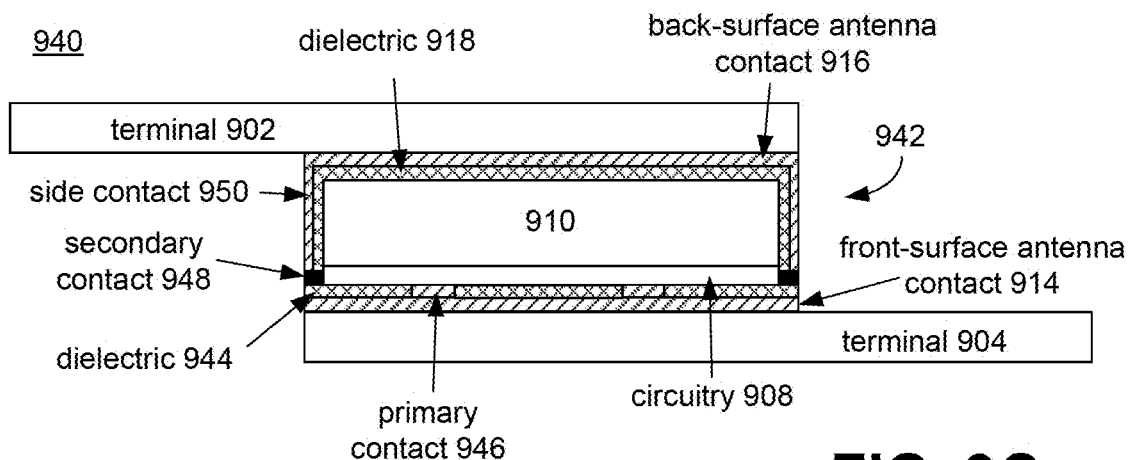

FIGS. 9A-C depict side cutaway views of dual-sided ICs electrically coupling to antenna terminals according to embodiments.

FIG. 9A depicts a side cutaway view 900 of a dual-sided IC 906 similar to dual-sided ICs 600 and 706 described above. Dual-sided IC 906 includes circuitry 908 disposed in or on its front surface (shown facing downward). Circuitry 908 is electrically coupled to antenna terminal 904 by means of its front-surface antenna contact 914. Dual-sided IC 906 also includes a back-surface antenna contact 916 that may couple to circuitry 908 by a number of methods—FIG. 9A shows one method which involves a through-IC via 912. In some embodiments, the through-IC via 912 may be electrically coupled to substrate 910; in other embodiments, it may be electrically isolated from substrate 910 (for example, by a dielectric layer disposed between the via 912 and the substrate 910); in yet other embodiments it may not be present at all. In the embodiment of FIG. 9A back-surface antenna contact 916, which couples to antenna terminal 902, is shown electrically isolated from substrate 910 by an optional dielectric layer 918. Of course, back-surface antenna contact 916 may be electrically coupled to substrate 910 as well. In some embodiments, optional bumps 920 and/or 922 may improve the coupling between the antenna contacts and the antenna terminals.

FIG. 9B depicts a side cutaway view 930 of a dual-sided IC 932 similar to IC 906 in FIG. 9A. Like IC 906, IC 932 includes circuitry 908 disposed in or on its front surface that is electrically coupled to terminal 904 by means of a front-surface antenna contact 914. Unlike FIG. 9A, IC 932 does not include a through-IC via; instead, circuitry 908 couples to terminal 902 through substrate 910. When IC 932 receives an RF signal across front-surface antenna contact 914 and back-surface antenna contact 916, the electrical potential difference across IC 932 causes current to flow from front-surface antenna contact 914 to back-surface antenna contact 916 through substrate 910, and/or vice-versa. Substrate 910 is typically conductive, but in some circumstances, it may be insulating and the current flow from front to back surface may be through the capacitance of insulating substrate 910. In other embodiments, substrate 910 may exhibit an inductance. In FIG. 9B, substrate 910 forms the back-surface antenna contact; in other embodiments, the back surface may include a metallic or semi-metallic layer (as in FIG. 8) or may be doped to have a high electrical conductivity. FIG. 9B also shows an optional dielectric layer 918 separating the back surface of IC 932 from terminal 902, so the coupling between them is capacitive, but of course a galvanic coupling is possible as well. Dielectric 918 may be deposited on substrate 910 or may be a naturally occurring oxide of substrate 910 such as $SiO_2$. Similarly, front-surface antenna contact 914 may capacitively couple with terminal 904 through an optional dielectric layer 934 or it may galvanically couple. The ordering of dielectric layer 934 and front-surface antenna contact 914 may be swapped, so that dielectric layer 934 is disposed on circuitry 908 and front-surface antenna contact 914 is disposed between dielectric layer 934 and terminal 904.

FIG. 9C depicts a side cutaway view 940 of a dual-sided IC 942 similar to IC 932 in FIG. 9B. Like with IC 932, IC 942 includes circuitry 908 disposed in or on its front surface, an optional front-surface dielectric layer 944, a front-surface antenna contact 914, a galvanically or capacitively coupled substrate 910, an optional back-surface dielectric layer 918 and a back-surface antenna contact 916. Unlike FIG. 9B, circuitry 908 couples to front-surface antenna contact 914 by means of one or more primary contacts 946 through dielectric layer 944. Also unlike FIG. 9B, dielectric layer 918 may be present on one or more side surfaces of IC 942. Back-surface antenna contact 916 may couple to a side contact 950 that spans at least one side of IC 942 and couples with circuitry 908 by means of secondary contacts 948 through dielectric layer 918. Essentially, side contact 950 forms a conductive or galvanic path from circuitry 908 to back-surface contact 918 that is an alternative to the through-IC via 912 in FIG. 9A. In some embodiments circuitry 908 may couple capacitively with side contact 950 rather than through secondary contacts 948. In other embodiments dielectric 944 does not cover one or more of the front, side, or back surfaces of IC 942.

Dielectric layer 918 may be a native oxide that forms on substrate 910 or may be deposited on IC 942. The oxide formation or deposition may occur at any time. Similarly, side contact 950 may be a region of substrate 910 doped for a conductivity that is higher than that of the native substrate 910 or may be deposited on substrate 910. The doping or deposition may occur at any time.

Figure 10A:
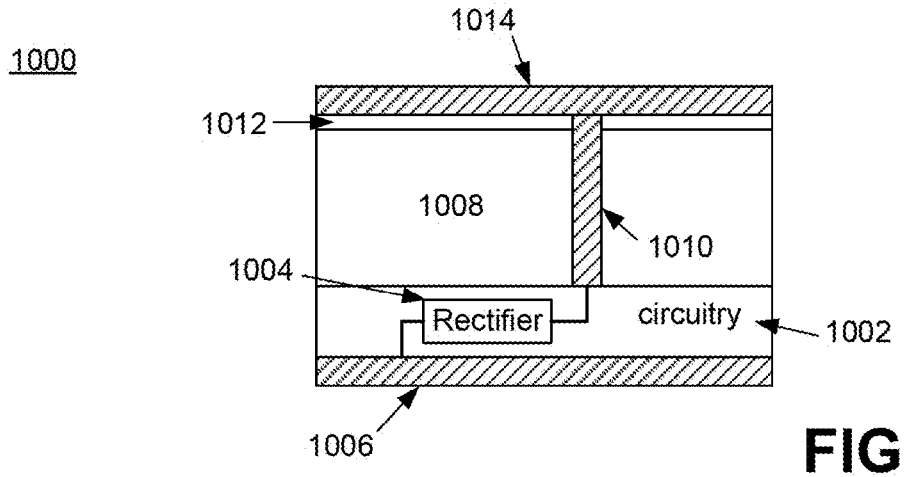
FIGS. 10A-C depict side cutaway views of rectifiers in a dual-sided IC electrically coupled to antenna contacts on different surfaces of the IC according to embodiments.
Figure 10B:
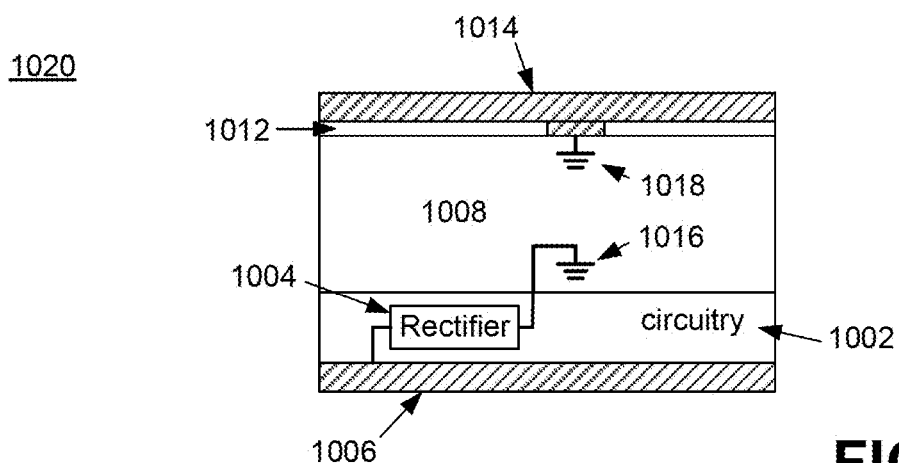
Figure 10C:
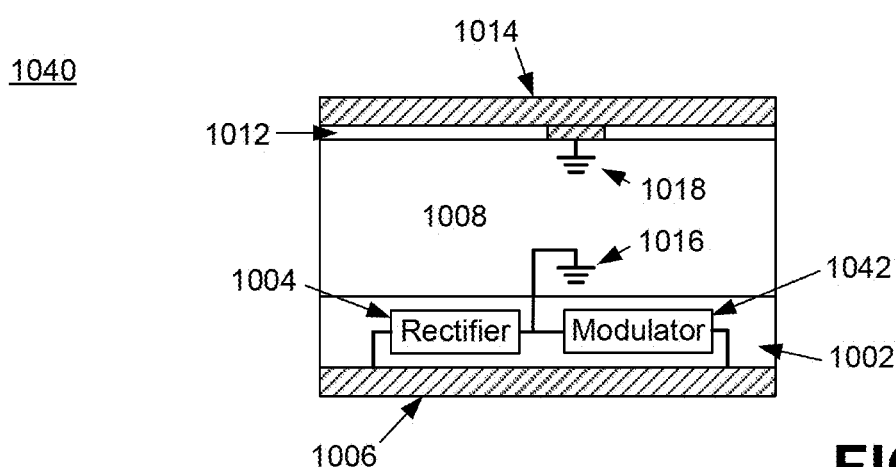

FIGS. 10A-C depict side cutaway views of dual-sided ICs with at least one circuit element electrically coupled to contacts on at least two surfaces of the IC according to embodiments. FIG. 10 shows the circuit element as a rectifier, but the element could be any circuit component such as those described in reference to FIG. 4. In some embodiments, the rectifier may be a charge pump—this disclosure uses the terms "rectifier" and "charge pump" interchangeably. Rectifiers as described herein are configured to couple to antennas, so in a dual-sided ICs they couple to the two antenna contacts on different surfaces of the IC. FIG. 10A depicts a dual-sided IC 1000 similar to dual-sided IC 906 described in reference to FIG. 9. Dual-sided IC 1000 includes, as part of circuitry 1002, a rectifier 1004 that is electrically coupled to front-surface antenna contact 1006 and to back-surface antenna contact 1014 by a through-IC via 1010. Like for IC 906, via 1010 may or may not be electrically coupled to IC substrate 1008, and a dielectric layer 1012 may optionally separate back-surface antenna contact 1014 from IC substrate 1008.

FIG. 10B depicts another dual-sided IC 1020, similar to dual-sided IC 1000 described in reference to FIG. 10A. The difference in FIG. 10B is that rectifier 1004 couples with back-surface antenna contact 1014 by means of substrate 1008 instead of by a through-IC via, shown schematically by back-surface antenna contact 1014 and rectifier terminal 1016 being grounded (i.e. back-surface antenna contact 1014 and rectifier terminal 1016 are electrically coupled through a conductive substrate at a common potential). Of course, the reference to ground as used herein means only a common potential and need not convey any connection with earth ground. In some embodiments, the substrate may be made conductive by doping; in other embodiments circuitry 1002 may be fabricated on an epitaxial layer of substrate 1008 that is either electrically coupled to or isolated from conductive substrate 1008. In the latter case rectifier terminal 1016 may couple to substrate 1008 capacitively.

FIG. 10C depicts another dual-sided IC 1040, similar to dual-sided IC 1020 described in reference to FIG. 10B. In IC 1040, circuitry 1002 also includes a modulator 1042 that is electrically coupled to front-surface antenna contact 1006 and back-surface antenna contact 1014. Modulator 1042 couples with back-surface antenna contact 1014 through substrate 1008, similar to rectifier 1004. When IC 1040 responds by backscattering (as described above in reference to FIG. 2), modulator 1042 may modulate the impedance (or admittance) between front-surface antenna contact 1006 and back-surface antenna contact 1014 in order to modify the current flowing through substrate 1008 (as described above in relation to FIG. 9B) and thereby generate the response. The total impedance between the two surface antenna contacts depends on the impedance of rectifier 1004, modulator 1042, and substrate 1008. By modulating its own impedance based on a desired reply signal, modulator 1042 alters the total impedance between the two surface antenna contacts and thereby modulates the currents flowing through substrate 1008. As a specific but not-limiting example, modulator 1042 may electrically connect and disconnect (via switching action) the two surface antenna contacts to generate the response signal.

Figure 11:
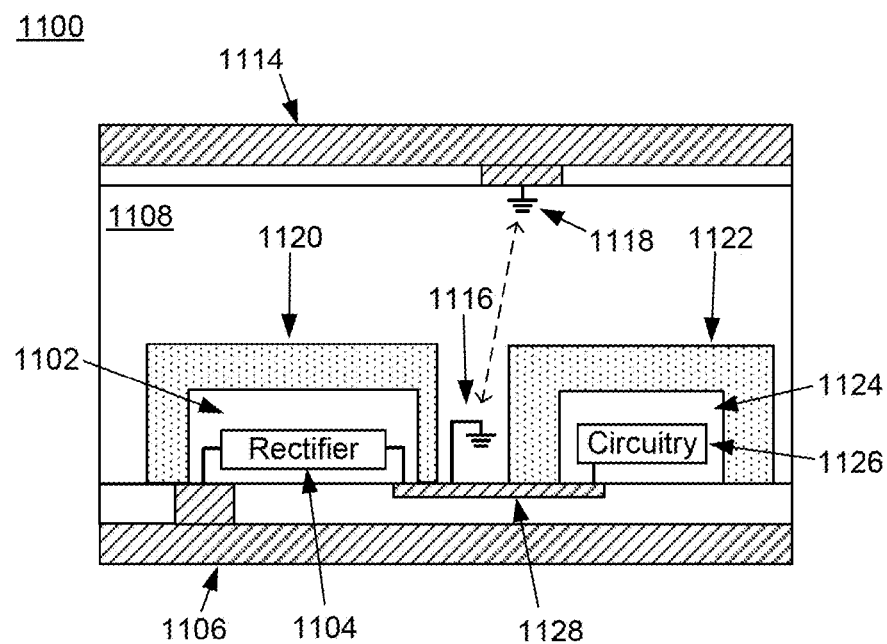
FIG. 11 depicts side cross-sections of some example implementations of dual-sided ICs where the IC substrate electrically couples circuitry to an antenna contact, according to embodiments.
Figure 11:
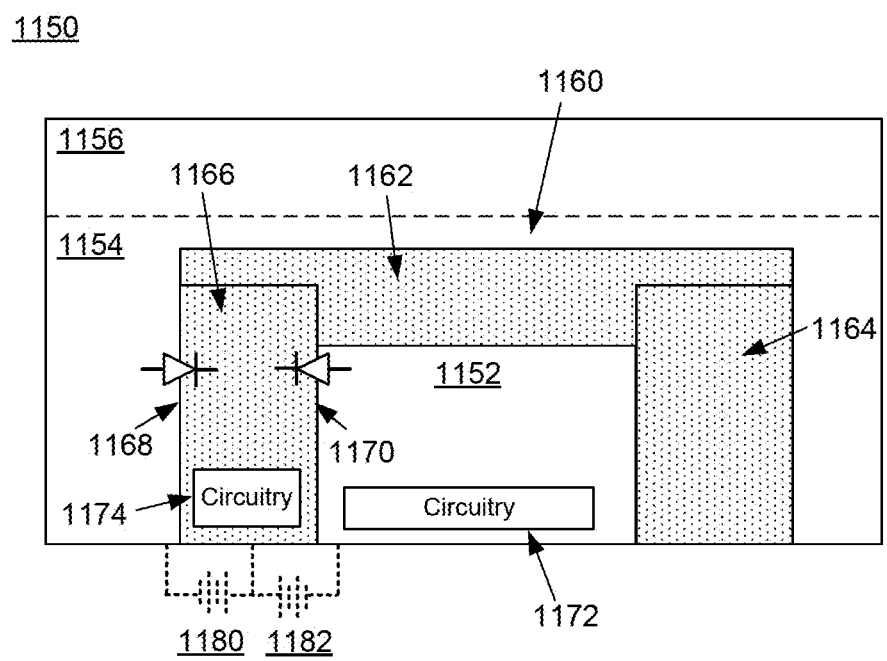

As described above, in some embodiments an electrically conductive substrate may couple circuitry to a back-surface antenna contact. To prevent electrical signals flowing through the substrate to the back-surface antenna contact from interfering with circuitry operation, the substrate or substrate portion carrying electrical signals to the back-surface antenna contact may be electrically isolated, at least partially, from the circuitry. FIG. 11 depicts side cross-sections of example implementations of dual-sided ICs where the IC substrate electrically couples circuitry to an antenna contact, according to embodiments. Dual-sided IC 1100, a portion of which is depicted in cross-section in FIG. 11, includes rectifier 1104 and circuitry 1126. Rectifier 1104 is electrically coupled to front-surface antenna contact 1106, and, through terminals 1116 and 1118, is electrically coupled to back-surface antenna contact 1114 by substrate 1108. Similar to dual-sided IC 1020, the electrical coupling between rectifier 1104 and back-surface antenna contact 1114 through substrate 1108 is shown schematically by terminals 1116 and 1118 being grounded. As with dual-sided IC 1020, the reference to ground means only a common potential and does not necessarily have any connection with earth ground. Circuitry 1126 may also electrically couple to rectifier 1104 and/or terminal 1116, via an interconnect 1128, as depicted.

IC 1100 further includes barrier regions 1120 and 1122 within substrate 1108. Barrier region 1120 may bound (e.g., form a boundary) a circuit region 1102 containing rectifier 1104 along multiple sides of circuit region 1102, thereby enclosing or surrounding the circuit region 1102 and physically separating circuit region 1102 from the rest of substrate 1108. Similarly, barrier region 1122 may bound a circuit region 1124 containing circuitry 1126 along multiple sides of circuit region 1124, thereby enclosing or surrounding the circuit region 1124 and physically separating circuit region 1124 from the rest of substrate 1108. In some embodiments, barrier regions 1120 and/or 1122 may be configured to form "tubs" within which circuit regions 1102 and/or 1124 reside, where the tubs bound but do not entirely enclose their respective circuit regions. For example, barrier region 1120 may not bound circuit region 1102 on the side closest to front-surface antenna contact 1106, but may bound circuit region 1102 on all other sides. In other embodiments, barrier regions 1120 and/or 1122 may entirely enclose, surround, or encapsulate their respective circuit regions, except for apertures, openings, and/or exposed areas through which electrical interconnects pass. In embodiments where a circuit region abuts or is adjacent to the edge of a substrate, an associated barrier region may bound the circuit region only on the sides of the circuit region facing into the substrate, or may also bound the circuit region on the sides of the circuit region facing away from the substrate.

Barrier regions 1120 and 1122 may further be configured to provide at least partial electrical isolation between their respective, enclosed circuit regions and the remainder of substrate 1108. In one embodiment, barrier regions 1120 and/or 1122 may be formed from a semiconductor material different from the semiconductor material of substrate 1108 and/or circuit regions 1102/1124. For example, if substrate 1108 and/or circuit regions 1102/1124 are formed from a native, p-type or p-doped semiconductor material, then barrier regions 1120 and/or 1122 may be formed from an n-type or n-doped semiconductor material. If substrate 1108 and/or circuit regions 1102/1124 are formed from an n-type or n-doped semiconductor material, then barrier regions 1120 and/or 1122 may be formed from a p-type or p-doped semiconductor material. The difference in composition between barrier regions 1102/1124 and substrate 1108 and/or circuit regions 1102/1124 may create interfaces between the respective regions that allow for at least partial electrical isolation between the respective regions.

Diagram 1150 is a cross-section of a portion of a dual-sided IC similar to IC 1100, showing some details of a barrier region 1160, similar to barrier regions 1120 and 1128. Barrier region 1160 may be formed in an IC substrate similar to IC substrate 1108, in an epitaxial layer 1154 disposed on a base substrate or layer 1156, in the base layer 1156, or at the interface between the epitaxial layer 1154 and the base layer 1156. Epitaxial layer 1154 may be electrically coupled to or isolated from base layer 1156. Barrier region 1160 at least partly encloses a circuit region 1152, which in turn contains circuitry 1172. In one embodiment, the IC substrate, epitaxial layer 1154, and circuit region 1152 may be p-type or p-doped, whereas barrier region 1160 may be n-type or n-doped. In this embodiment, circuitry 1172 may include n-type metal-oxide-semiconductor (NMOS) devices and/or p-type metal-oxide-semiconductor (PMOS) devices. If the latter are present, they may be disposed in separate n-wells (N-doped regions) in circuit region 1152.

Barrier region 1160 may be formed using any suitable means. For example, barrier region 1160 may be formed by implanting a deep n-well 1162 into the IC substrate to form a "bottom" or "floor" of barrier region 1160, and implanting n-wells 1164, 1166, and other n-wells (not depicted) to form the "walls" of barrier region 1160. As another example, barrier region 1160 may be formed by implanting an n-well, then implanting a p-well within the n-well smaller than and contained within the n-well, or vice-versa. When thus configured, interfaces 1168 and 1170 between barrier region 1160 and the IC substrate and circuit region 1152, respectively, may form PN junctions that function as front-to-front PN diodes, as depicted in diagram 1150. When biased appropriately, or even in the absence of biasing, the interfaces 1168 and 1170 may prevent current flow between the IC substrate and circuit region 1152 through barrier region 1160, thereby electrically isolating the IC substrate from circuit region 1152. In some embodiments, voltage biasing may be applied to interfaces 1168 and/or 1170, to aid or enhance electrical isolation between the IC substrate and circuit region 1152. For example, optional voltages 1180 and/or 1182 may be applied to interface 1168 and/or interface 1170, respectively. The optional voltages 1180/1182 may be configured to reverse-bias the PN junctions associated with interfaces 1168/1170, to further prevent current flow through interfaces 1168/1170. The optional voltages 1180/1182 may be generated and applied to circuit region 1152, barrier region 1160, and/or layer 1154 by circuitry 1172, circuitry 1174 (described below), and/or another circuit block electrically coupled to barrier region 1160.

In some embodiments, portions of barrier region 1160 may include circuitry. For example, n-well 1166 may include circuitry 1174, especially PMOS devices. Barrier region 1160 may also be able to at least partially electrically isolate circuitry 1174 from the IC substrate, for example if the PN junction associated with interface 1168 is reverse-biased. In some embodiments, instead of a barrier region as described, an appropriately-doped well may be used to at least partially electrically isolate circuitry from the IC substrate, along the lines of circuitry 1174. For example, in some embodiments both circuit region 1152 and barrier region 1160 may be part of the same doped well (e.g., an n-well or a p-well), and therefore be formed from the same type of semiconductor material, at least in terms of doping. In these embodiments, a PN-junction-forming interface between the doped well and the IC substrate, similar to interface 1168, may be reverse-biased sufficiently to reduce or prevent current flow through the interface between the doped well and the IC substrate, thereby at least partially electrically isolating the IC substrate from circuitry within the doped well.

In other embodiments, barrier regions may be partially or completely formed of other material. For example, barrier region "bottoms" or "floors" may include an epitaxial or buried insulating layer, formed using an oxide, nitride, or other insulating material. Barrier region "walls" may include insulating material, and may be formed using techniques such as trench isolation or other, similar techniques.

Figure 12:
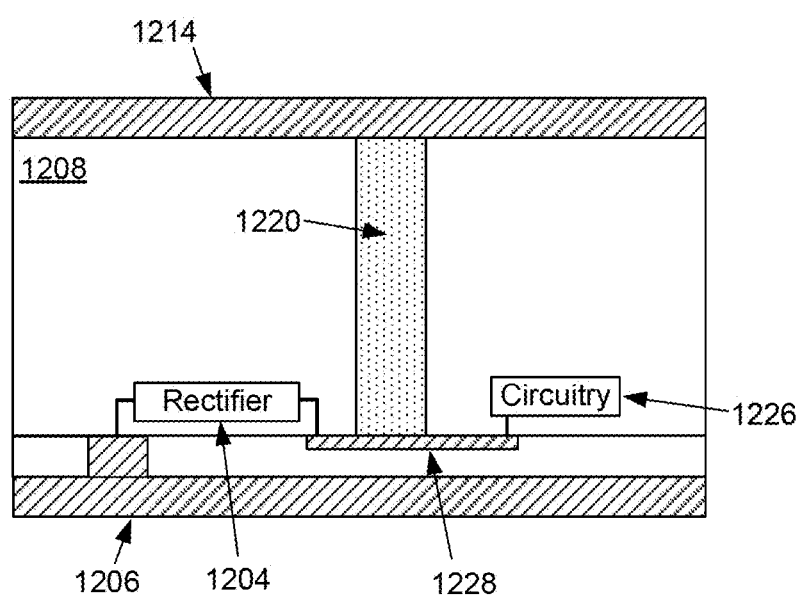
FIG. 12 depicts a side cross-section of an example implementation of dual-sided ICs where a portion of the IC substrate electrically couples circuitry to an antenna contact, according to embodiments.

In some embodiments, portion(s) of an IC substrate may be configured to improve electrical conductivity through the IC substrate. FIG. 12 depicts a side cross-section of an example implementation of dual-sided ICs where a portion of the IC substrate electrically couples circuitry to an antenna contact, according to embodiments. Dual-sided IC 1200, a portion of which is depicted in cross-section in FIG. 12, includes rectifier 1204 and circuitry 1226, which may be electrically coupled to each other via interconnect 1228. Rectifier 1204 is electrically coupled to front-surface antenna contact 1206, and is electrically coupled to back-surface antenna contact 1214 via interconnect 1228 and a substrate portion 1220. Substrate portion 1220 is a portion of IC substrate 1208 that has higher electrical conductivity than the rest of IC substrate 1208, in effect acting as a through-chip via, but is made from semiconductor material similar to the IC substrate 1208 rather than an entirely different material, such as metal or the like. For example, substrate portion 1220 may have the same type of doping as IC substrate 1208 or a different type of doping, and may be more highly doped than IC substrate 1208. The higher doping of substrate portion 1220 may mean that electrical conductivity through substrate portion 1220 is higher than the rest of IC substrate 1208, which may then increase the overall electrical conductivity between rectifier 1204 and/or circuitry 1228 (for example, through interconnect 1228) and back-surface antenna contact 1214. Substrate portion 1220 may physically couple to back-surface antenna contact 1214 and/or interconnect 1228, or may couple via one or more intermediary portions (e.g., one or more layers of highly-doped semiconductor material), selected to facilitate electrical coupling between substrate portion 1220 and back-surface antenna contact 1214 and/or interconnect 1228. In embodiments where substrate portion 1220 has a different type of doping than IC substrate 1208, the interface between substrate portion 1220 and IC substrate 1208 may be biased, as described above, to provide at least partial electrical isolation between substrate portion 1220 and IC substrate 1208.

In some embodiments, the substrate of an IC may be thinned to further increase the overall electrical conductivity between circuitry within the IC substrate and a back-surface antenna contact. For example, the substrate may be thinned using an etching or grinding process. Thinning may be combined with one or more of the techniques described above to facilitate electrical coupling between circuitry within an IC and a back-surface antenna contact.

The above figures should not be construed as limiting the types or elements of circuitry that may couple across multiple surfaces of a dual-sided IC. As will be described below, other circuits that may similarly couple include modulators, PMUs, antenna-routing nodes, impedance matching circuits, ESD circuits, and indeed any circuitry present in an RFID IC.

In some embodiments, dielectric 918/934/944 in FIGS. 9A-C may be or may include a nonconductive stabilization layer. The stabilization layer may aid in mitigating mounting capacitance variations due to varying mounting forces.

Figure 13:
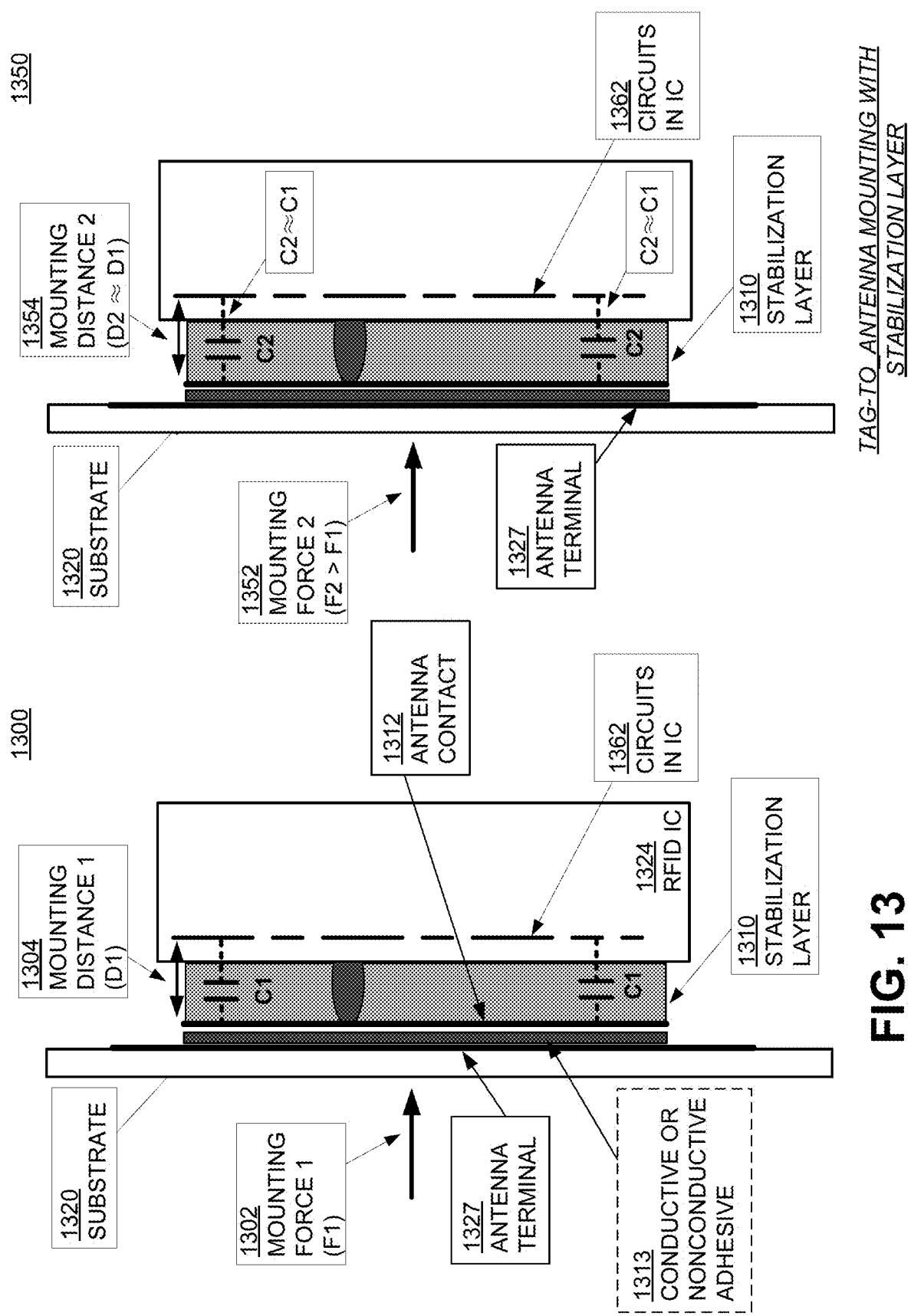
FIG. 13 depicts stabilization layers used to reduce capacitance variations between dual-sided ICs and antenna terminals according to embodiments.

FIG. 13 depicts stabilization layers used to reduce capacitance variations between dual-sided ICs and antenna terminals according to embodiments. Diagram 1300 shows an RFID strap or inlay comprising substrate 1320 and antenna terminal 1327 being pressed against RFID IC 1324 with a mounting force F1 (1302), where antenna terminal 1327 and antenna contact 1312 are separated from the IC by stabilization layer 1310. Mounting distance D1 (1304) is fixed by stabilization layer 1310, producing a similarly fixed mounting capacitance C1.

Diagram 1350 shows the RFID strap or inlay being pressed against the RFID IC with a mounting force F2 (1352) which is larger than mounting force F1. The presence of stabilization layer 1310 ensures that mounting distance D2 (1354) is substantially the same as mounting distance D1 (1304) despite the larger mounting force F2. As a result, mounting capacitance C2 is substantially similar to mounting capacitance C1, helping ensure that the tags have similar tuning and therefore similar performance characteristics.

In some embodiments, bumps formed through openings in stabilization layer 1310 electrically couple circuits 1362 to antenna contact 1312. Stabilization layer 1310 may be an organic or inorganic material, typically (although not necessarily) with a relatively low dielectric constant and a reasonable thickness to provide small capacitance. An anisotropic conductive adhesive, patterned conductive adhesive, or nonconductive adhesive 1313 may optionally be applied between the IC and the strap/inlay to attach the IC to the strap/inlay, either or both physically and electrically. If adhesive layer 1313 is nonconductive then it is typically sufficiently thin that at the frequencies of RFID communications it provides a low-impedance capacitive path between antenna terminal 1327 and antenna contact 1312.

In some embodiments antenna contact 1312, similar to contact pads 804 or 806 in FIG. 8, substantially covers the surface of RFID IC 1324. For reasons of clarity, FIG. 13 does not show the back-surface antenna contact such as contact 1014 in FIG. 10. It should be apparent that this back-surface antenna contact may be formed with or without a stabilization layer, independent or whether the IC front surface includes a stabilization layer, and that this back-surface stabilization layer can be or can include the dielectric layer 1012 in FIG. 10.

Figure 14A:
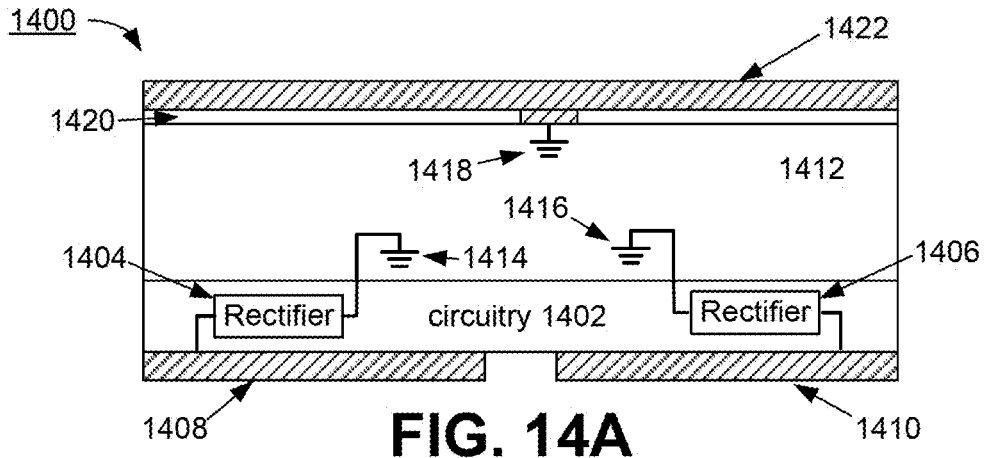
FIGS. 14A-C depict side cutaway views of rectifiers in a dual-differential dual-sided IC coupling to contacts on different surfaces of the IC.
Figure 14B:
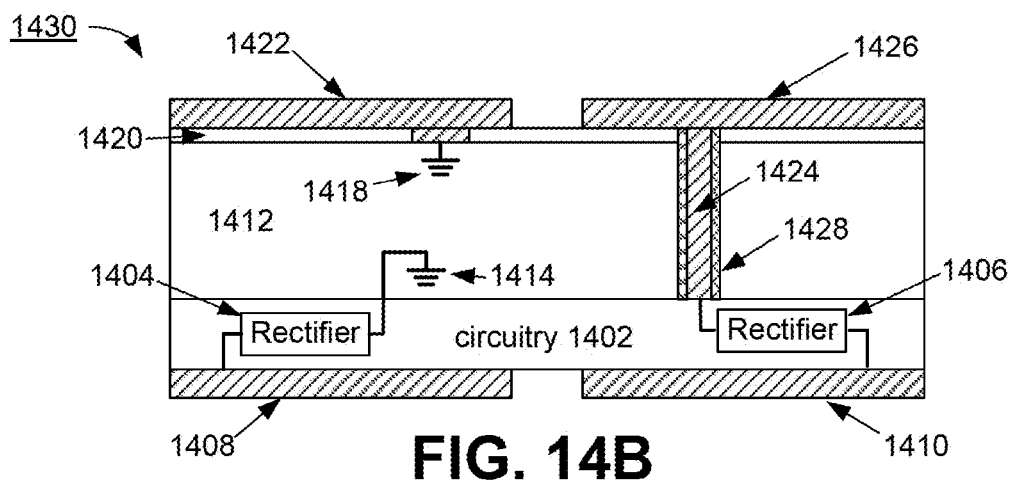
Figure 14C:
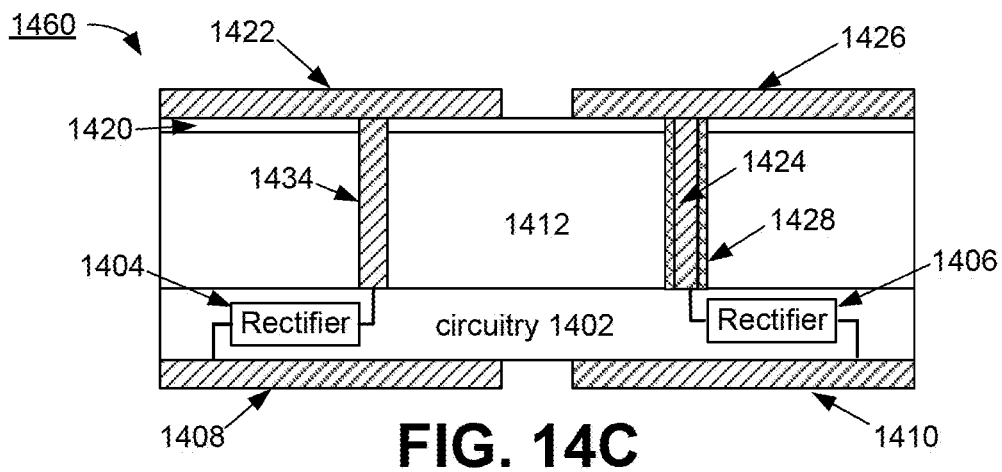

FIGS. 14A-C depict side cutaway views of rectifiers in dual-differential dual-sided ICs coupling to contacts on multiple surfaces of the IC. Dual-differential RFID ICs contain two or more electrically isolated antenna ports, in which an odd-mode excitation on one antenna port produces essentially no excitation on another antenna port.

Dual-differential ICs typically include multiple rectifiers, each electrically coupled to a different antenna port. FIG. 14A depicts a first dual-differential dual-sided IC 1400 including circuitry 1402 having a first rectifier 1404 and a second rectifier 1406. First rectifier 1404 is electrically coupled to a first front-surface antenna contact 1408, and second rectifier 1406 is electrically coupled to a second front-surface antenna contact 1410. Both rectifiers couple to a back-surface antenna contact 1422 through substrate 1412, using the techniques described above. Similar to FIGS. 10B and 11, the reference to ground means only a common potential and need not convey any connection with earth ground.

FIG. 14B depicts a second dual-differential dual-sided IC 1430 including circuitry 1402 having a first rectifier 1404 and a second rectifier 1406. IC 1430 is similar to IC 1400 described in reference to FIG. 14A, but IC 1430 includes two back-surface contacts with first rectifier 1404 coupling to back-surface antenna contact 1422 by means of substrate 1412, using the techniques described above, and second rectifier 1406 coupling to back-surface antenna contact 1426 by a through-die via 1424 which is typically electrically isolated from substrate 1412 by a dielectric layer 1428.

FIG. 14C depicts a third dual-differential dual-sided IC 1460 including circuitry 1402 having a first rectifier 1404 and a second rectifier 1406. IC 1460 is similar to IC 1430 described in reference to FIG. 14B, but IC 1460 includes two through-IC vias with first rectifier 1404 coupling to back-surface antenna contact 1422 by through-die via 1434 and second rectifier 1406 coupling to back-surface antenna contact 1426 by through-die via 1424. Typically, at least one, and often both, of these through-IC vias are electrically isolated from substrate 1412 by a dielectric layer 1428.

The above specification, examples, and data provide a complete description of the composition, manufacture, and use of the embodiments. Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims and embodiments.

According to some examples, a Radio Frequency Identification (RFID) integrated circuit (IC) is provided. The IC may include an electrically conductive IC substrate, a circuit region within the IC substrate, and an electrically conductive barrier region formed within the IC substrate. The IC substrate may have one of an n-type doping and a p-type doping. The barrier region may have the other one of the n-type doping and the p-type doping. The barrier region may electrically isolate the circuit region from the IC substrate. The IC may further include a first circuit block disposed in the circuit region, a first antenna contact disposed on a first surface of the IC substrate and electrically coupled to the first circuit block, and a second antenna contact disposed on a second surface of the IC substrate opposite the first surface, where the electrically conductive IC substrate electrically couples the second antenna contact to the first circuit block.

According to other examples, a Radio Frequency Identification (RFID) integrated circuit (IC) is provided. The IC may include an electrically conductive IC substrate, a circuit region formed within the IC substrate and electrically isolated from the substrate, and a first circuit block disposed in the circuit region. The IC may further include a first antenna contact disposed on a first surface of the IC substrate and electrically coupled to the first circuit block, and a second antenna contact disposed on a second surface of the IC substrate different from the first circuit block, where the electrically conductive IC substrate electrically couples the second antenna contact to the first circuit block.

According to further examples, a Radio Frequency Identification (RFID) integrated circuit (IC) is provided. The IC may include an electrically conductive IC substrate, a circuit region within the IC substrate, and an electrically conductive barrier region formed within the IC substrate. The IC substrate may be formed of a first type of semiconductor material, and the first barrier region may be formed of a second type of semiconductor material different from the first type of semiconductor material. The barrier region may electrically isolate the circuit region from the IC substrate. The IC may further include a first circuit block disposed in the first circuit region, a first antenna contact disposed on a first surface of the IC substrate and electrically coupled to the first circuit block, and a second antenna contact disposed on a second surface of the IC substrate opposite the first surface, where the electrically conductive IC substrate electrically couples the second antenna contact to the first circuit block.

According to further examples, a Radio Frequency Identification (RFID) integrated circuit (IC) is provided. The IC may include an electrically conductive IC substrate formed of a first type of semiconductor material, a first, electrically conductive, region formed within the IC substrate of a second type of semiconductor material different than the first type, and a first circuit block disposed in the first region. The IC may further include a first antenna contact disposed on a first surface of the IC substrate and electrically coupled to the first circuit block, and a second antenna contact disposed on a second surface of the IC substrate opposite the first surface. The second antenna contact may be electrically isolated from the first antenna contact, and the electrically conductive IC substrate may electrically couple the second antenna contact to the first circuit block.

According to some embodiments, the first circuit block may be electrically coupled to the first antenna contact via a first coupling capacitor and electrically coupled to the second antenna contact via a second coupling capacitor. A reverse-biased PN junction between the barrier region and the circuit region may provide the electrical isolation. The IC may further include a second circuit block electrically coupled to the barrier region and configured to generate a voltage to reverse-bias the PN junction.

According to other embodiments, the IC substrate may include an epitaxial layer and a base layer, where the epitaxial layer is disposed on the base layer and the circuit region is formed within the epitaxial layer. One or more of the first and second antenna contacts may include at least one conductive pad spanning substantially an entire surface of the IC substrate. The first circuit block may include a charge pump electrically coupled to the first and second antenna contacts such that a current flow is from the first antenna contact to the second antenna contact through the electrically conductive IC substrate during a first phase of an incident RF signal and is from the second antenna contact to the first antenna contact through the electrically conductive substrate during a second phase of the incident RF signal.

According to further embodiments, the circuit region may be one of an n-well and a p-well, and the IC substrate may have a doping opposite that of the circuit region. The first type of semiconductor material may be p-type semiconductor material, and the second type of semiconductor material may be n-type semiconductor material. The IC may further include an interface between the barrier region and the circuit region, where the interface provides the electrical isolation in response to the application of a voltage bias across the interface. The second circuit block may be configured to generate and apply the voltage bias.

We claim:
1. A Radio Frequency Identification (RFID) integrated circuit (IC) comprising:
   an IC substrate containing a circuit block;
   a first nonconductive stabilization layer disposed on at least a portion of a first surface of the IC substrate;
   a first conductive pad disposed on the first stabilization layer and electrically coupled to the circuit block;
   a second nonconductive stabilization layer disposed on at least a portion of a second surface of the IC substrate different from the first surface;
   a second conductive pad electrically isolated from the first conductive pad, disposed on the second stabilization layer, and electrically coupled to the circuit block; and
   an electrically conductive path disposed within the IC substrate and electrically coupling the circuit block to the second conductive pad.

2. The RFID IC of claim 1, wherein the electrically conductive path is a through-IC via.

3. The RFID IC of claim 2, wherein the through-IC via includes a metal.

4. The RFID IC of claim 2, wherein the through-IC via is electrically isolated from the IC substrate.

5. The RFID IC of claim 1, wherein the electrically conductive path includes a highly doped portion of the IC substrate.

6. The RFID IC of claim 5, wherein the highly doped portion of the IC substrate is electrically isolated from at least another portion of the IC substrate.

7. The RFID IC of claim 1, wherein the second surface is opposite the first surface.

8. The RFID IC of claim 1, wherein at least one of:
   the first conductive pad substantially spans the first surface; and
   the second conductive pad substantially spans the second surface.

9. A Radio Frequency Identification (RFID) integrated circuit (IC) comprising:
   an IC substrate containing a circuit block;
   a first nonconductive stabilization layer disposed on at least a portion of a first surface of the IC substrate;
   a first antenna contact disposed on the first stabilization layer and electrically coupled to the circuit block;
   a second nonconductive stabilization layer disposed on a second surface of the IC substrate opposite to the first surface;
   a second antenna contact electrically isolated from the first antenna contact, disposed on the second stabilization layer, and electrically coupled to the circuit block; and
   a through-IC via disposed within the IC substrate and electrically coupling the circuit block to the second antenna contact.

10. The RFID IC of claim 9, wherein the through-IC via is electrically isolated from the IC substrate.

11. The RFID IC of claim 9, wherein the through-IC via includes a metal.

12. The RFID IC of claim 9, wherein the through-IC via includes a highly doped portion of the IC substrate.

13. The RFID IC of claim 12, wherein the highly doped portion of the IC substrate is electrically isolated from at least another portion of the IC substrate.

14. The RFID IC of claim 9, wherein at least one of:
the first antenna contact includes at least one conductive pad substantially spanning the first surface; and
the second antenna contact includes at least one conductive pad substantially spanning the second surface.

15. A Radio Frequency Identification (RFID) integrated circuit (IC) comprising:
an IC substrate containing a circuit block;
a first nonconductive stabilization layer disposed on at least a portion of a first surface of the IC substrate;
a first antenna contact disposed on the first stabilization layer and electrically coupled to the circuit block;
a second nonconductive stabilization layer disposed on a second surface of the IC substrate opposite to the first surface; and
a second antenna contact electrically isolated from the first antenna contact, disposed on the second stabilization layer, and electrically coupled to the circuit block;
wherein at least one electrically conductive portion of the IC substrate electrically couples the circuit block to the second antenna contact.

16. The RFID IC of claim 15, wherein the at least one electrically conductive portion is more electrically conductive than another portion of the IC substrate.

17. The RFID IC of claim 16, wherein the electrically conductive portion of the IC substrate is highly doped.

18. The RFID IC of claim 15, wherein the electrically conductive portion of the IC substrate is electrically isolated from at least another portion of the IC substrate.

19. The RFID IC of claim 15, wherein the electrically conductive portion of the IC substrate is electrically coupled to at least another portion of the IC substrate.

20. The RFID IC of claim 15, wherein at least one of:
the first antenna contact includes at least one conductive pad substantially spanning the first surface; and
the second antenna contact includes at least one conductive pad substantially spanning the second surface.

* * * * *